(12) United States Patent
Forrest et al.

(10) Patent No.: US 8,766,291 B2
(45) Date of Patent: Jul. 1, 2014

(54) STACKED WHITE OLED HAVING SEPARATE RED, GREEN AND BLUE SUB-ELEMENTS

(75) Inventors: Stephen Forrest, Ann Arbor, MI (US); Xiangfei Qi, Ann Arbor, MI (US); Michael Slootsky, Ann Arbor, NJ (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 13/124,698

(22) PCT Filed: Oct. 28, 2009

(86) PCT No.: PCT/US2009/062354
§ 371 (c)(1),
(2), (4) Date: Jun. 24, 2011

(87) PCT Pub. No.: WO2010/062643
PCT Pub. Date: Jun. 3, 2010

(65) Prior Publication Data
US 2011/0248249 A1    Oct. 13, 2011

Related U.S. Application Data

(60) Provisional application No. 61/109,074, filed on Oct. 28, 2008.

(51) Int. Cl.
| | |
|---|---|
| H01L 29/20 | (2006.01) |
| H01L 33/00 | (2010.01) |
| H01L 29/201 | (2006.01) |
| H01L 29/08 | (2006.01) |
| H01L 35/24 | (2006.01) |
| H01L 51/00 | (2006.01) |
| H01L 31/00 | (2006.01) |

(52) U.S. Cl.
USPC ........ 257/89; 257/440; 257/90; 257/E27.142; 257/E31.121; 257/E31.122; 257/E31.123; 257/E51.022

(58) Field of Classification Search
USPC ........ 257/40, 89, 90, E51.022, 440, E27.142, 257/E31.121, E31.122, E31.123
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
(Continued)

FOREIGN PATENT DOCUMENTS

| | | |
|---|---|---|
| EP | 1 339 112 | 8/2003 |
| KR | 2008 0068472 | 7/2006 |
(Continued)

OTHER PUBLICATIONS

PCT International Search Report and Written Opinion from PCT/US2009/062354 mailed on May 4, 2010.

(Continued)

*Primary Examiner* — Ida M Soward
(74) *Attorney, Agent, or Firm* — Morgan Lewis & Bockius LLP

(57) ABSTRACT

The present invention relates to efficient organic light emitting devices (OLEDs). The devices employ three emissive sub-elements, typically emitting red, green and blue, to sufficiently cover the visible spectrum. Thus, the devices may be white-emitting OLEDs, or WOLEDs. Each sub-element comprises at least one organic layer which is an emissive layer—i.e., the layer is capable of emitting light when a voltage is applied across the stacked device. The sub-elements are vertically stacked and are separated by charge generating layers. The charge-generating layers are layers that inject charge carriers into the adjacent layer(s) but do not have a direct external connection.

10 Claims, 22 Drawing Sheets

(56) References Cited

U.S. PATENT DOCUMENTS

| | | | |
|---|---|---|---|
| 5,389,797 A * | 2/1995 | Bryan et al. | 257/21 |
| 5,674,636 A * | 10/1997 | Dodabalapur et al. | 428/690 |
| 5,683,823 A * | 11/1997 | Shi et al. | 428/690 |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,892,786 A * | 4/1999 | Lott | 372/50.124 |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,337,102 B1 | 1/2002 | Forrest et al. | |
| 6,468,819 B1 | 10/2002 | Kim et al. | |
| 6,548,956 B2 | 4/2003 | Forrest et al. | |
| 6,576,134 B1 | 6/2003 | Agner et al. | |
| 6,602,540 B2 | 8/2003 | Gu et al. | |
| 7,431,968 B1 | 10/2008 | Shtein et al. | |
| 7,507,486 B2 * | 3/2009 | Ren | 428/690 |
| 7,525,129 B2 * | 4/2009 | Masuda et al. | 257/103 |
| 7,528,810 B2 * | 5/2009 | Ohshima et al. | 345/77 |
| 7,551,660 B2 * | 6/2009 | Lutgen | 372/50.124 |
| 7,696,681 B2 * | 4/2010 | Park | 313/503 |
| 7,768,194 B2 * | 8/2010 | Forrest et al. | 313/504 |
| 7,943,202 B2 * | 5/2011 | Chui et al. | 427/468 |
| 8,178,217 B2 * | 5/2012 | Nomura et al. | 428/690 |
| 8,253,157 B2 * | 8/2012 | Jorgenson | 257/98 |
| 8,513,658 B2 * | 8/2013 | D'Andrade et al. | 257/40 |
| 8,557,399 B2 * | 10/2013 | D'Andrade et al. | 428/690 |
| 2002/0034656 A1 | 3/2002 | Thompson et al. | |
| 2002/0055015 A1 | 5/2002 | Sato et al. | |
| 2002/0182441 A1 | 12/2002 | Lamansky et al. | |
| 2003/0068528 A1 | 4/2003 | Thompson et al. | |
| 2003/0072964 A1 | 4/2003 | Kwong et al. | |
| 2003/0175553 A1 | 9/2003 | Thompson et al. | |
| 2003/0189401 A1 * | 10/2003 | Kido et al. | 313/504 |
| 2003/0230980 A1 | 12/2003 | Forrest et al. | |
| 2004/0174116 A1 | 9/2004 | Lu et al. | |
| 2005/0029933 A1 | 2/2005 | Liao et al. | |
| 2005/0110398 A1 | 5/2005 | Lee | |
| 2005/0140275 A1 | 6/2005 | Park | |
| 2005/0164033 A1 | 7/2005 | Chin et al. | |
| 2005/0173700 A1 | 8/2005 | Liao et al. | |
| 2005/0264174 A1 | 12/2005 | Liao et al. | |
| 2006/0087225 A1 * | 4/2006 | Liao et al. | 313/504 |
| 2006/0157696 A1 * | 7/2006 | Katoda | 257/43 |
| 2006/0186796 A1 * | 8/2006 | Yabe et al. | 313/504 |
| 2006/0232194 A1 * | 10/2006 | Tung et al. | 313/504 |
| 2006/0280964 A1 * | 12/2006 | Liu | 428/690 |
| 2007/0116983 A1 | 5/2007 | Kanno et al. | |
| 2008/0007165 A1 * | 1/2008 | Suzuki et al. | 313/504 |
| 2008/0102310 A1 * | 5/2008 | Thompson et al. | 428/690 |
| 2008/0171226 A1 * | 7/2008 | Noh et al. | 428/690 |
| 2008/0312437 A1 * | 12/2008 | Inoue et al. | 544/225 |
| 2009/0033212 A1 * | 2/2009 | Ahn et al. | 313/504 |
| 2009/0278444 A1 * | 11/2009 | Forrest et al. | 313/504 |
| 2009/0284134 A1 * | 11/2009 | Iida et al. | 313/504 |
| 2010/0045174 A1 * | 2/2010 | Okabe et al. | 313/504 |

FOREIGN PATENT DOCUMENTS

| | | |
|---|---|---|
| WO | WO 02/074015 | 9/2002 |
| WO | WO 03/092334 | 11/2003 |
| WO | WO 2004/085450 | 10/2004 |
| WO | WO 2008/020696 | 2/2008 |

OTHER PUBLICATIONS

Misra et al., 2006, "White Organic LEDs and their recent advancements", Semiconductor Science and Technology, 21:R35-R47.

Cheng et al., 2006, "White organic light-emitting devices with a phosphorescent multiple emissive layer", Applied Physics Letters, 89:043504-1-043504-3.

M. A. Baldo et al., "Highly efficient phosphorescent emission from organic electroluminescent devices," Nature, vol. 395, pp. 151-154. (1998).

M.A. Baldo et al., "Very high-efficiency green organic light-emitting devices based on electrophosphorescence", Applied Physics Letters, vol. 75, No. 1, pp. 4-6 (1999).

C. Adachi et al., "Nearly 100% Internal Phosphorescence Efficiency in an Organic Light Emitting Device", J. Appl. Phys., vol. 90, No. 10, pp. 5048-5051 (2001).

Matsumoto et al., "Multiphoton Organic EL device having Charge Generation Layer", International Manufacturing and Engineering Services (IMES) Co. Ltd., 413-414.

Liao et al., "High-efficiency tandem organic light-emitting diodes" (Attachment C to PRIN-36101 disclosure), Applied Physics Lett. 84(2)167-169.

Matsumoto et al., "High Efficiency Organic EL Devices having Charge Generation Layers", IMES Co., SID 03 Digest, 964-5.

Holmes et al., 2003, "Efficient, deep-blue organic electrophosphorescence by guest charge trapping", Appl. Phys. Lett. 83(18):3818-3820.

Sajoto et al., 2005, "Recent progress in blue phosphorescent iridium(III) complexes and their application to organic light emitting devices (OLEDs)", Abstracts of Papers, 229$^{th}$ ACS National Meeting, San Diego, CA, United States, Mar. 13-17, 2005, INOR-455, American Chemical Society: Washington, D.C.

CAS Registry for 664374-03-2 on STN.

International Preliminary Report on Patentability from PCT/US2009/062354 mailed on May 12, 2011.

* cited by examiner (A)

(B)

R-G-B:

B-G-R:

(a)

(b)

STACKED WHITE OLED HAVING SEPARATE RED, GREEN AND BLUE SUB-ELEMENTS

CROSS-REFERENCE TO RELATED APPLICATION

This application is a U.S. national stage application under 35 U.S.C. 371 of PCT/US2009/062354, filed Oct. 28, 2009, which claims the benefit of U.S. Provisional Patent Application No. 61/109,074, filed Oct. 28, 2008, both of which are incorporated herein by reference in their entirety.

STATEMENT REGARDING FEDERALLY SPONSORED RESEARCH OR DEVELOPMENT

This invention was made with U.S. Government support under Contract No. DE-FG02-07ER84809 awarded by the Department of Energy. The government may have certain rights in this invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to efficient organic light emitting devices (OLEDs). More specifically, the present invention relates to white-emitting OLEDs, or WOLEDs. The devices of the present invention employ three emissive sub-elements, typically emitting red, green and blue, to sufficiently cover the visible spectrum. The sub-elements are separated by charge generating layers. This allows the construction of bright and efficient WOLEDs that exhibit a high color rendering index.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

The quality of white illumination sources can be described by a simple set of parameters. The color of the light source is given by its CIE chromaticity coordinates x and y. The CIE coordinates are typically represented on a two dimensional plot. Monochromatic colors fall on the perimeter of the horseshoe shaped curve starting with blue in the lower left, running through the colors of the spectrum in a clockwise direction to red in the lower right. The CIE coordinates of a light source of given energy and spectral shape will fall within the area of the curve. Summing light at all wavelengths uniformly gives the white or neutral point, found at the center of the diagram (CIE x,y-coordinates, 0.33, 0.33). Mixing light from two or more sources gives light whose color is represented by the intensity weighted average of the CIE coordinates of the independent sources. Thus, mixing light from two or more sources can be used to generate white light. While the two component and three component white light sources may appear identical to an observer (CIE x,y-coordinates, 0.32, 0.32), they may not be equivalent illumination sources. When considering the use of these white light sources for illumination, the CIE color rendering index (CRI) may be useful in addition to the CIE coordinates of the source. The CRI gives an indication of how well the light source will render colors of objects it illuminates. A perfect match of a given source to the standard illuminant gives a CRI of 100. Though a CRI value of at least 70 may be acceptable for certain applications, a preferred white light source will have a CRI of about 80 or higher.

White organic light-emitting diodes (WOLEDs) have shown their potential as a new generation of solid-state lighting sources. However, in order to be practical for general lighting applications, it is important to obtain high efficiency at high luminance (for example, around 1000 cd/m$^2$). Conventional WOLEDs have introduced red, green, and blue (R, G, and B) phosphorescent and/or fluorescent dopants in either a single emission layer (EML), or multiple emissive layers that allow for exciton formation in an expanded region. For the latter structure, a suitable combination of hosts and phosphorescent dopants can be difficult due to the multiple constraints that are placed on the relative energies of the constituents in these architectures.

SUMMARY OF THE INVENTION

The present invention provides a stacked OLED in which individual red (R), green (G) and blue (B) sub-elements are vertically stacked and electrically connected by transparent charge-generating layers (CGL). The combined emission from the red, green and blue sub-elements provide a white emission from the stacked device.

In one embodiment of the present invention, the stacked organic light emitting device comprises in order a cathode; a red-emitting sub-element comprising an emissive layer comprising a phosphorescent red emissive material; a charge-generating layer; a green-emitting sub-element comprising an emissive layer comprising a phosphorescent green emissive material; a charge-generating layer; a blue-emitting sub-element comprising an emissive layer comprising a phosphorescent blue emissive material; and an anode; wherein a combined emission of the emissive materials gives a white emission from the device.

In another embodiment of the present invention, the stacked organic light emitting device comprises in order a cathode; a red-emitting sub-element comprising an emissive layer comprising a phosphorescent red emissive material; a charge-generating layer; a blue-emitting sub-element comprising an emissive layer comprising a phosphorescent blue emissive material; a charge-generating layer; a green-emitting sub-element comprising an emissive layer comprising a phosphorescent green emissive material; and an anode; wherein a combined emission of the emitting materials gives a white emission from the device.

In another embodiment of the present invention, the stacked organic light emitting device comprises in a cathode; a red-emitting sub-element comprising an emissive layer comprising a phosphorescent red emissive material; a charge-generating layer; a green-emitting sub-element comprising an emissive layer comprising a phosphorescent green emissive material; a charge-generating layer; a blue-emitting sub-element comprising an emissive layer comprising a phosphorescent blue emissive material; and an anode; wherein a combined emission of the emissive materials gives a white emission from the device; and wherein each of the red, green and blue sub-elements are substantially charge balanced. To achieve charge balance and high efficiency in each sub-element in the stack, different charge balancing mechanisms may be used for each element. These include (I) adjusting the thickness of the ETL, (2) inserting charge blocking layer(s) around the EML and (3) adjusting the thickness of the HTL. Thus, in preferred embodiments of the invention, the charge balance factor, $\gamma$, is near unity for each of the subcells in the stacked device. Preferably, the charge balance factor for each of the sub-cells is from about 0.9 to 1, and more preferably from about 0.95 to 1.

In preferred embodiments, each sub-element comprises a hole transporting layer, an electron transporting layer and the emissive layer, wherein the emissive layer is the hole transporting layer, the electron transporting layer or a separate layer.

In a preferred embodiment of the invention, each of the emissive layers of the stacked OLED is close enough to its antinode so as to provide at least 90% of its maximum emission.

In preferred embodiments of the invention, the charge-generating layers comprise a material selected from $MoO_3$, $V_2O_5$, ITO, $TiO_2$, $WO_3$ and $SnO_2$.

It is an object of the invention to provide a stacked WOLED having a high efficiency. Thus, in preferred embodiments, the device has a total maximum external quantum efficiency of at least about 30%.

It is an object of the invention to provide a stacked WOLED having a high efficiency at high brightness. Thus, in preferred embodiments, the device has a total external quantum efficiency of at least about 28% at a brightness of about 1000 cd/m$^2$.

It is a further object of the invention to provide a stacked WOLED having a white emission that is suitable for indoor lighting applications. Thus, in preferred embodiments, the device emits light having CIE coordinates of X=0.37±0.08, and Y=0.37±0.08.

It is a further object of the invention to provide a stacked WOLED having a high CRI. Thus, in preferred embodiment, the device emits light having a CRI of at least 70, and more preferably at least 75.

DETAILED DESCRIPTION

Figure 1:
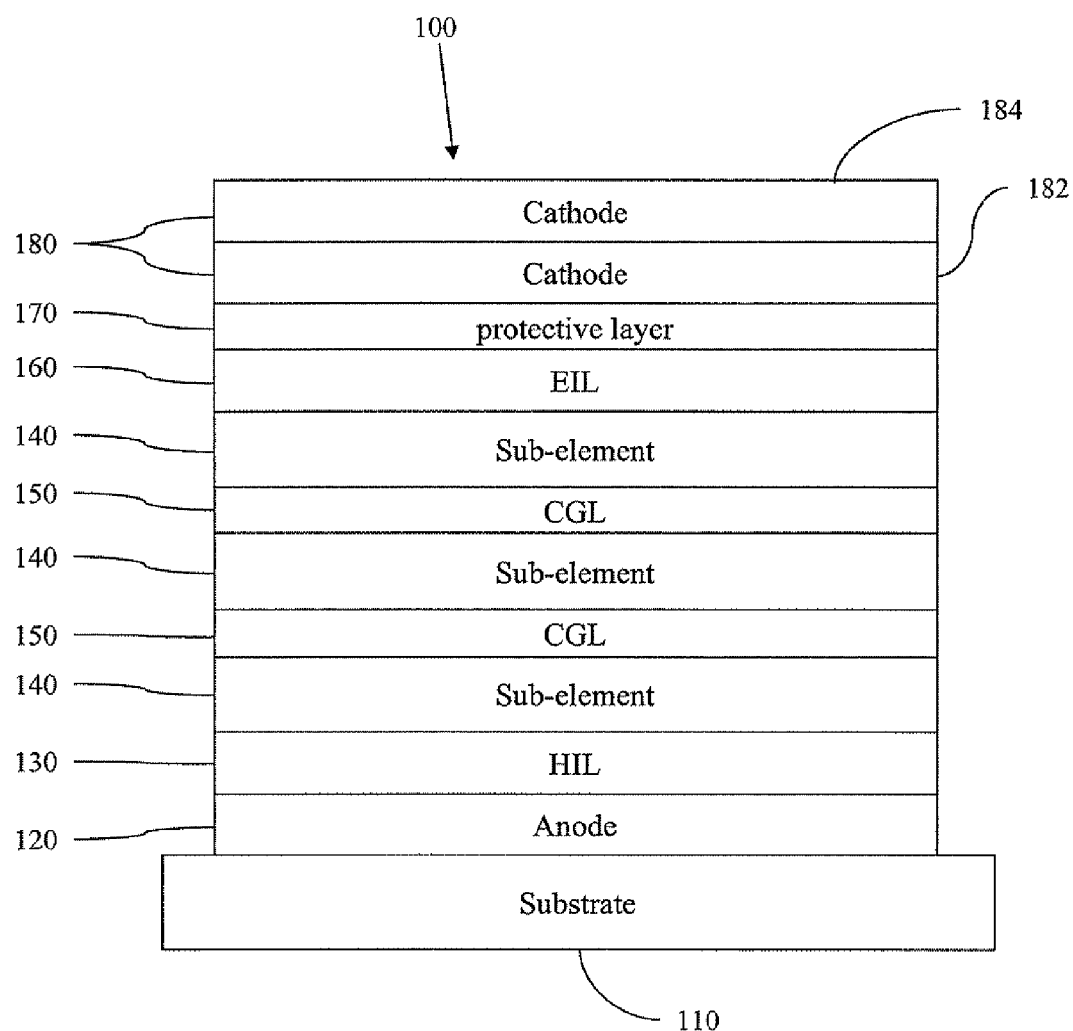
FIG. 1 shows a stacked organic light emitting device having individual sub-elements separated by charge generating layer, as well as other layers.

The present invention provides a stacked OLED in which individual red (R), green (G) and blue (B) sub-elements are vertically stacked and electrically connected by transparent charge-generating layers (CGL).

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002/0034656; 2002/0182441; 2003/0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tan, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows a stacked organic light emitting device 100. The figures are not necessarily drawn to scale. Device 100 may include a substrate 110, an anode 120, a hole injection layer 130, OLED sub-elements 140, charge-generating layers 150, an electron injection layer 160, a protective layer 170, and a cathode 180. Cathode 180 may be a compound cathode having a first conductive layer 182 and a second conductive layer 184. Device 100 may be fabricated by depositing the layers described, in order.

Figure 2:
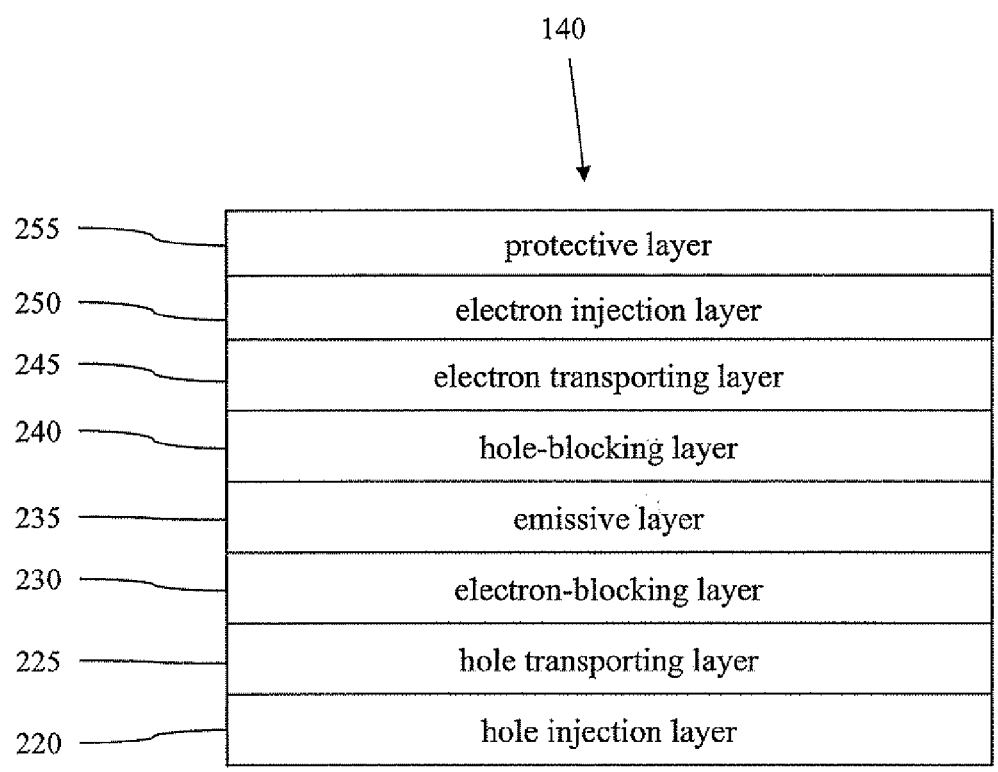
FIG. 2 shows a sub-element having an emissive layer, as well as other layers.

FIG. 2 shows a sub-element 140. Each OLED sub-element 140 may include a hole injection layer 220, a hole transport layer 225, an electron blocking layer 230, an emissive layer 235, a hole blocking layer 240, an electron transport layer 245, an electron injection layer 250, a protective layer 255. Each separate sub-element may have a different layer structure from the other sub-elements and/or may be comprised of different materials.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 120 may be any suitable anode that is sufficiently conductive to transport holes to the organic layers. The material of anode 120 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 120 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 120 may be opaque and/or reflective. A reflective anode 120 may be preferred for some top-emitting devices, to increase the amount of light emitted from the top of the device. The material and thickness of anode 120 may be chosen to obtain desired conductive and optical properties. Where anode 120 is transparent, there may be a range of thickness for a particular material that is thick enough to provide the desired conductivity, yet thin enough to provide the desired degree of transparency. Other anode materials and structures may be used.

Generally, injection layers are comprised of a material that may improve the injection of charge carriers from one layer, such as an electrode or a charge generating layer, into an adjacent organic layer. Injection layers may also perform a charge transport function. In device 100, hole injection layer 130 may be any layer that improves the injection of holes from anode 120 into an adjacent organic layer. CuPc is an example of a material that may be used as a hole injection layer from an ITO anode 120, and other anodes. In device 100, electron injection layer 160 may be any layer that improves the injection of electrons into an adjacent organic layer. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the surface of the anode or a charge-generating layer so as to provide efficient hole injection from the anode or charge-generating layer into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and a hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer or charge-generating layer. For example, an HIL thickness of as little as 10 nm may be acceptable for a very smooth anode surface. However, since anode surfaces tend to be very rough, a thickness for the HIL of up to 50 nm may be desired in some cases.

The stacked OLED 100 includes three individual sub-elements 140. Each sub-element preferably emits a different primary color. Thus, the stacked device preferably comprises a red-emitting sub-element, a green-emitting sub-element and a blue-emitting sub-element. Ideally the combined emission of the individual sub-elements gives a white emission from the device.

A sub-element comprises at least one organic layer which is an emissive layer—i.e., the layer is capable of emitting light when a voltage is applied across the stacked device. The emissive layer comprises a phosphorescent emissive material, preferably as a dopant in a host material. In more preferred device structures, each sub-element comprises at least two layers, one which is an electron transporting layer and one which is a hole transporting layer. In this embodiment, either the electron transporting layer or the hole transporting layer may be the emissive layer. In particularly preferred embodiments, the electron transporting layer is the emissive layer. In other preferred device structures, the sub-element comprises at least three layers—an electron transporting layer, an emissive layer and a hole transporting layer. In the embodiments having such a separate emissive layer, the emissive layer may be primarily conduct electrons or holes. Additional layers may be added to a sub-element. FIG. 2 shows a sub-element 140. Each OLED sub-element 140 may include a hole injection layer 220, a hole transport layer 225, an electron blocking layer 230, an emissive layer 235, a hole blocking layer 240, an electron transport layer 245, an electron injection layer 250, a protective layer 255. Each OLED sub-element 140 in the stacked OLED 100 may have the same layer structure or different layer structure from the other sub-elements.

The charge-generating layers 150 are layers that injects charge carriers into the adjacent layer(s) but do not have a direct external connection. The charge-generating layers 150 separate the sub-elements 140 of the stacked OLED. Each of the charge-generating layers 150 may be composed of the same material(s), or many have different compositions. When a voltage is applied across the stacked OLED having a charge-generating layer, the charge-generating layer may inject holes into the organic phosphorescent sub-element on the on the cathode side of the charge-generating layer, and electrons into the organic phosphorescent sub-element on the anode side. As will be understood by one skilled in the art, the "anode side" of a layer or device refers to the side of the layer or device at which holes are expected to enter the layer or device. Similarly, a "cathode side" refers to the side of the layer or device to which electrons are expected to enter the layer or device.

Each charge-generating layer may be formed by the contact of doped n-type (Li, Cs, Mg, etc. doped) layer with a p-type (metal oxides, F4-TCNQ, etc.) layer. In preferred embodiments, the doped n-type layer may be selected from an alkali metal or alkaline earth metal doped organic layer, such as Li doped BCP or Mg doped Alq$_3$, with Li doped BCP being preferred. In other preferred embodiments, the charge-generating layers comprise an inorganic material selected from stable metal oxides, including MoO$_3$, V$_2$O$_5$, ITO, TiO$_2$, WO$_3$ and SnO$_2$. In particularly preferred embodiments of the invention, the charge-generating layers employ a layer of MoO$_3$ or V$_2$O$_5$, with MoO$_3$ being most preferred.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 170 may reduce damage to underlying organic layers during the fabrication of cathode 180. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 170 is preferably thick enough that there is little or no damage to underlying layers due to fabrication processes that occur after organic protective layer 160 is deposited, yet not so thick as to significantly increase the operating voltage of device 100. Protective layer 170 may be doped to increase its conductivity. For example, a CuPc or BCP protective layer may be doped with Li. A more detailed description of protective layers may be found in U.S. patent application Ser. No. 09/931,948 to Lu et al., which is incorporated by reference in its entirety.

Cathode 180 may be any suitable material or combination of materials known to the art, such that cathode 180 is capable of conducting electrons and injecting them into the organic layers of device 100. Cathode 180 may be transparent or opaque, and may be reflective. Metals and metal oxides are examples of suitable cathode materials. Cathode 180 may be a single layer, or may have a compound structure. FIG. 1 shows a compound cathode 180 having a thin metal layer 182 and a thicker conductive metal oxide layer 184. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 180 that is in contact with the underlying organic layer, whether it is a single layer cathode 180, the thin metal layer 182 of a compound cathode, or some other part, is preferably made of a material having a work function lower than about 4 eV (a "low work function material"). Other cathode materials and structures may be used.

Hole transport layer 225 includes a material capable of transporting holes. Hole transport layer 225 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Preferred hole transporting compounds include aromatic tertiary amines, including but not limited to α-NPD, TPD, MTDATA, and HMTPD. Other hole transport layers may be used.

Emissive layer 235 includes an organic material capable of emitting light when a current is passed between anode 120 and cathode 180. Preferably, emissive layer 235 contains a phosphorescent emissive material. Phosphorescent materials are preferred because of the higher luminescent efficiencies associated with such materials. Emissive layer 235 may also comprise a host material capable of transporting electrons and/or holes, doped with an emissive material that may trap electrons, holes, and/or excitons, such that excitons relax from the emissive material via a photoemissive mechanism. Emissive layer 235 may comprise a single material that combines transport and emissive properties. Whether the emissive material is a dopant or a major constituent, emissive layer 235 may comprise other materials, such as dopants that tune the emission of the emissive material. Emissive layer 235 may include a plurality of emissive materials capable of, in combination, emitting a desired spectrum of light. Examples of phosphorescent emissive materials include $Ir(ppy)_3$. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 235 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 245 may include a material capable of transporting electrons. Electron transport layer 245 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Blocking layers may be used to reduce the number of charge carriers (electrons or holes) and/or excitons that leave the emissive layer. An electron blocking layer 230 may be disposed between emissive layer 235 and the hole transport layer 225, to block electrons from leaving emissive layer 235 in the direction of hole transport layer 225. Similarly, a hole blocking layer 240 may be disposed between emissive layer 235 and electron transport layer 245, to block holes from leaving emissive layer 235 in the direction of electron transport layer 245. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

In alternative embodiments, the OLED of FIG. 1 may in the form of an "inverted" OLED, in which the substrate is adjacent to the cathode rather than the anode. Such an inverted device may be fabricated by depositing the layers described, in order on the substrate.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Thus, certain layers may combine the function of two or more of the layers in a single layer. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, a hole transport layer may both transport holes and injects holes into an emissive layer, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

In preferred embodiments, each sub-element comprises a hole transporting layer, an electron transporting layer and an emissive layer, wherein the emissive layer is the hole transporting layer, the electron transporting layer or a separate layer.

The red-emitting sub-element comprises an emissive layer that includes a phosphorescent red emissive material. Phosphorescent red emitting materials are known in the art and includes Ir(III)-bis-(2-phenylquinolyl-N,$C^{2'}$)-acetylacetonate (PQIr).

The green-emitting sub-element comprising an emissive layer comprising a phosphorescent green emissive material. Phosphorescent green emitting materials are known in the art and include tris-(phenylpyridine) iridium ($Ir(ppy)_3$).

The blue-emitting sub-element comprises an emissive layer that includes a phosphorescent blue emissive material. Phosphorescent blue emitting materials are known in the art and include bis-(4',6'-difluorophenylpyridinato)tetrakis(1-pyrazolyl)borate (FIr6). When a phosphorescent blue-emitting dopant is used, the host may be preferably selected from a high energy gap host, or a "wide-gap" host material. Wide-gap hosts have an energy gap that is greater than about 3.0 eV, and preferably the energy gap is about 3.2 eV or greater, and an energy gap of about 3.5 eV or greater may be particularly preferred. The wide gap host material may be selected from materials disclosed in U.S. published application No. 2004/0209116, which is incorporated herein by reference in its entirety. A charge-carrying dopant may be employed in addition to the emissive material in the emissive layer.

In achieving the high efficiency and balanced white emission from the stacked devices of the present invention the order of the red, blue and green sub-elements in the stacked device may be an important consideration. For balanced emission intensities from each OLED sub-element, it may be important to control the optical interference and to optimize the weak microcavity effects in the stacked structure in order to achieve the desired white color performance. The extraction efficiencies of the red, green and blue sub-units in the stacked OLED may be obtained by Cavity Modeling Framework (CAMFR), software based on a combination of eigenmode expansion and advanced boundary condition. By varying the orders of red, green and blue sub-units and the thickness of organic layers, the simulation shows that the power extracted into air is a function of both the wavelength and the source position (i.e., top, middle, and bottom, with the bottom sub-element closest to the ITO/substrate and the top sub-element closest to the cathode). The results indicate that red, green and blue sub-elements, arranged in different orders, have different extraction efficiencies and thus yield different color temperature and color rending indices (CRI) of the stacked device with other parameters staying the same.

Figure 3:
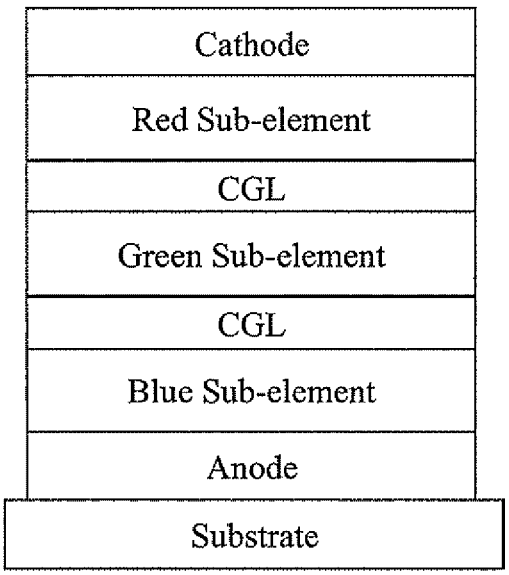
FIG. 3 shows schematic device structures for the white-emitting OLEDs of the present invention having red, green and blue sub-elements separated by charge-generating layers.
Figure 3:
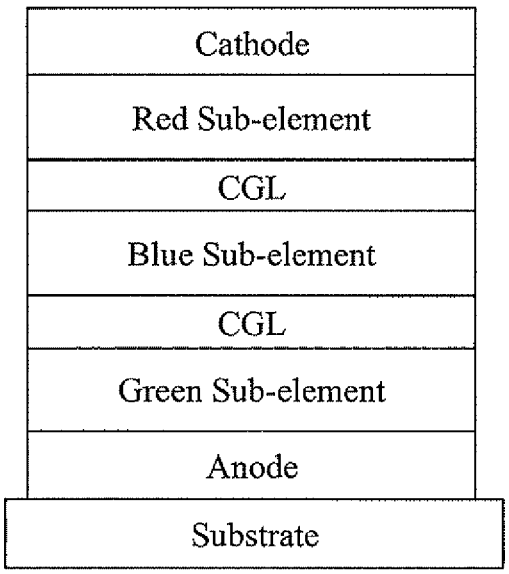

In certain preferred embodiments of the invention, the red-emitting sub-element is the top sub-element in the stacked WOLED. In one embodiment, the red-emitting sub-element is the top sub-element, the green-emitting sub-element is the middle sub-element and the blue-emitting sub-element is the bottom sub-element (see FIG. 3A). In another embodiment, the red-emitting sub-element is the top sub-element, the blue-emitting sub-element is the middle sub-element and the green-emitting sub-element is the bottom sub-element (see FIG. 3B).

With a particular optimized RGB order, the light output can be further optimized by adjusting the location of each emitter relative to the metal electrode. With the emitter closer to one of its optical antinodes (emitter to cathode round trip phase change equal $(2n+1)\pi$ with n=1, 2, etc.), the corresponding emission can be boosted, and vice versa. One way to adjust the emitter location is to add a layer with high carrier mobility in sub-elements, or to adjust the layer thickness of one or layers of the sub-element. Preferably, the emissive layers are within about 20% of the distance to an antinode for that emitter. Thus, in preferred embodiments at least two of the emissive layers, and more preferably all of the emissive layers, are close enough to an antinode so as to provide at least 90% of its maximum emission, and more preferably at least 95% of its maximum emission.

A further consideration may be the injection efficiency for a charge carrier from an electrode or a charge-generating layer into the adjacent sub-element. There may be a tradeoff between good electrical injection and good color rendition. Thus, for example, in order to maximize the CRI and CIE parameters of the white emission from the device, the order of the emissive sub-elements may be important. In certain embodiments of the invention, a lower emission from the green sub-element relative to the red and blue sub-elements is acceptable, or even preferred, when obtaining a balanced white emission. In this embodiment, the green sub-element is preferably the middle sub-element, as the injection efficiency from the two adjacent charge-generating layers may be less efficient than the injection from an adjacent electrode.

Charge injection from the compound CGL may be modeled based on a two-step process consisting of tunneling-assisted thermionic emission over an injection barrier of (1.2±0.2) eV and a trap level due to oxygen vacancies at (0.06±0.01) eV above the $MoO_3$ valence band edge.

Figure 12:
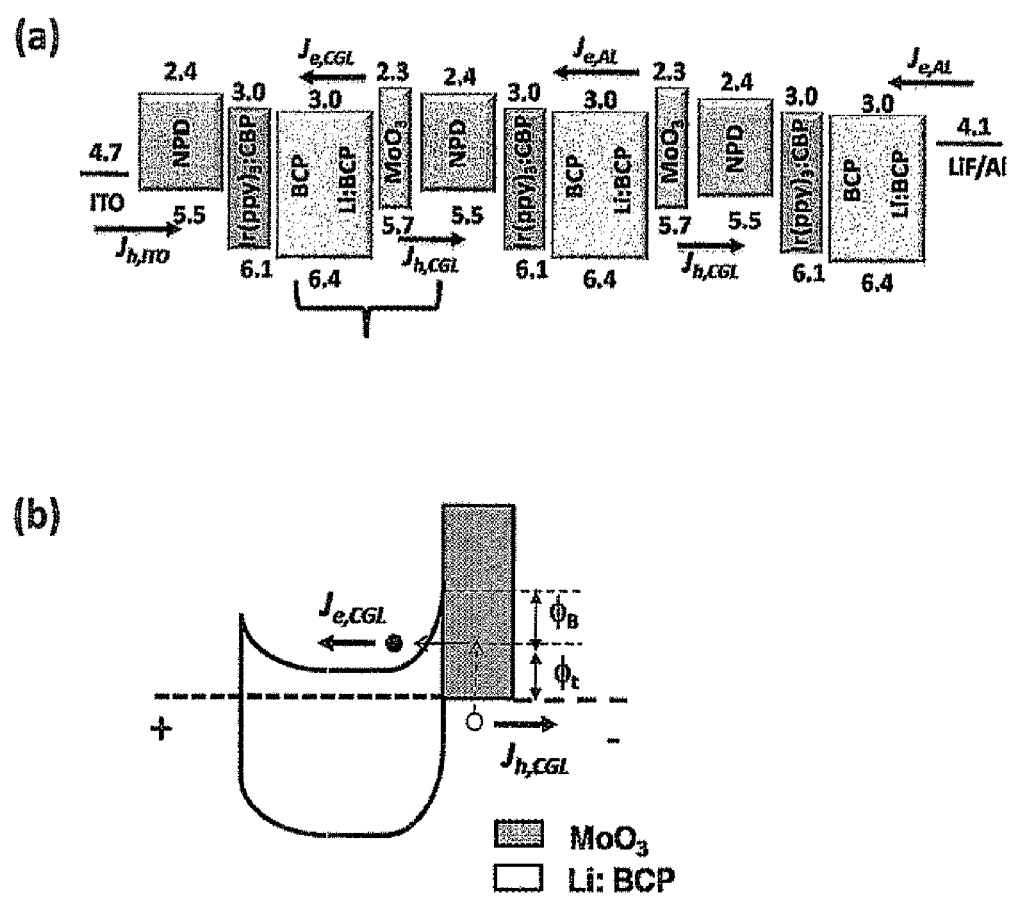
FIG. 12 shows (a) the proposed energy-level diagram of a three-subelement tris-(phenylpyridine)iridium (Ir(ppy)$_3$) SOLED; and (b) the energy level of a CGL in a proposed thermally assisted tunneling model, where $\Phi_t$ is the trap level with respect to MoO$_3$ valence band maximum, and $\Phi_B$ is the tunneling barrier. Holes (open circle) and electrons (solid circle) are then dissociated under the electric field, resulting in current density of $J_{h,CGL}$ and $J_{e,CGL}$, respectively.

Without being limited by theory, it is believed that electron injection occurs via thermionically excited electrons into traps located at energy, $\Phi_t$, above the metal oxide (e.g., $MoO_3$, etc.) valence band maximum, as shown in FIG. 12b. This is followed by field-assisted tunneling through the thin depletion region of the adjacent, doped organic layer. At applied voltage, V, the electron ($J_{e,CGL}$) and hole ($J_{h,CGL}$) current densities in the CGL interface region in FIG. 12 follow:

$$J_{e,CGL}=J_{h,CGL}=qv_eN_tfP(V) \qquad (1)$$

where $f=1/(1+\exp[q\Phi_t/kT])$ is the Fermi-Dirac function, q is the elementary charge, k is Boltzmann's constant, T is the temperature, $\Phi_t$ is the trap level above the metal oxide ($MoO_3$) valence band maximum, $v_e$ is the free electron velocity, $N_t$ is the trap concentration, and P(V) is the tunneling probability over an interface barrier of height, $\Phi_B$. Now, $$P(V) = \exp\left[-\frac{\alpha}{E(V)}\phi_B^{3/2}\right], \qquad (2)$$

where $\alpha=(4\sqrt{2m_s^*q})/3\hbar$
for a triangular energy barrier. Here, E(V) is the electric field at voltage, V, $m_s^*$ is the electron effective mass in the organic semiconductor, and $\hbar$ is the Planck's constant divided by $2\pi$.

The exciton generation rate at current density J is:

$$G(J) = \qquad (3)$$
$$\int G(x,J)dx = \frac{1}{q}\int \frac{d[J_s(x)]}{dx}dx = -\frac{1}{q}\int \frac{d[J_h(x)]}{dx}dx \equiv \frac{1}{q}J\gamma,$$

where G(x,J) is the volume generation rate of excitons between positions x and x+dx in the EML, with x=0 taken at the EML/ETL interface. The integration is across the entire width of the EML. The charge balance factor, $\gamma$, is the ratio of holes to electrons injected into the EML, given by:

$$\gamma = \frac{J_{h,A}-J_{h,C}}{J} = \frac{J_{e,C}-J_{e,A}}{J}, \qquad (4)$$

where $J_{h,A}$, $J_{h,C}$, $J_{e,A}$, $J_{e,C}$ are the hole (h) and electron (e) current densities at the anode (A) and cathode (C) sides of the EML. For high-efficiency electrophosphorescent OLEDs, the charge balance factor is near unity, indicating that equal numbers of electrons and holes are simultaneously present in the recombination zone.

In a preferred aspect of the invention, the efficiency of the stacked OLED is improved by balancing the efficiency and charge injection across each sub-element. Each sub-cell with the stacked device is preferably charged balanced. In certain embodiments of the invention, the top element of a stacked OLED having three sub-elements comprises a conventional cathode and a CGL (e.g. $MoO_3$/Li:BCP) anode, the middle OLED comprises a CGL for both cathode and anode, and the bottom element consists of a CGL cathode and ITO anode. To achieve equally high efficiency in each sub-element in the stack, different charge balancing mechanisms may be used for each element. These include (I) adjusting the thickness of the ETL, (2) inserting charge blocking layer(s) around the EML and (3) adjusting the thickness of the HTL.

Thus, in preferred embodiments of the invention, the charge balance factor, γ, is near unity for each of the subcells in the stacked device. Preferably, the charge balance factor for each of the sub-cells is from about 0.9 to 1, and more preferably from about 0.95 to 1.

The optimized stacked WOLEDs of the present invention show a high efficiency. In preferred embodiments the stacked devices of the present invention have a total maximum external quantum efficiency of at least about 30%. More preferably, the stacked devices of the present invention have a total maximum external quantum efficiency of at least about 35%. In particularly preferred embodiments, the stacked WOLEDs of the present invention will have a high efficiency at a high brightness. Particularly preferred stacked WOLEDs of the present invention have a total external quantum efficiency of at least about 28% at a brightness of 1000 cd/m$^2$, and more preferably at least about 32%.

The combined emission from the red, green and blue sub-elements give a white emission from the stacked OLED. In preferred embodiments, the device is capable of emitting light having CIE coordinates of X=0.37±0.08, and Y=0.37±0.08. More preferably, the device is capable of emitting light having CIE coordinates of X=0.33±0.02, and Y=0.33±0.02. Moreover, the devices of present invention are preferably capable of producing a white emission having CRI of at least about 70. More preferably, the CRI is higher than about 75, and still more preferably the CRI is higher than about 80.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

| Material Definitions and Abbreviations: | |
|---|---|
| CBP | 4,4'-N,N-dicarbazole-biphenyl |
| m-MTDATA | 4,4',4''-tris(3-methylphenylphenlyamino)triphenylamine |
| Alq$_3$ | 8-tris-hydroxyquinoline aluminum |
| Bphen | 4,7-diphenyl-1,10-phenanthroline |
| n-Bphen | n-doped BPhen (doped with lithium) |
| F$_4$-TCNQ | tetrafluoro-tetracyano-quinodimethane |
| p-MTDATA | p-doped m-MTDATA (doped with F$_4$-TCNQ) |
| Ir(ppy)$_3$ | tris(2-phenylpyridine)-iridium |
| Ir(ppz)$_3$ | tris(1-phenylpyrazoloto,N,C(2')iridium(III) |
| BCP | 2,9-dimethyl-4, 7-diphenyl-1,10-phenanthroline |
| TAZ | 3-phenyl-4-(1'-naphthyl)-5-phenyl-1,2,4-triazole |
| CuPc | copper phthalocyanine |
| ITO | indium tin oxide |
| NPD | N,N'-diphenyl-N-N'-di(1-naphthyl)-benzidine |
| TPD | N,N'-diphenyl-N-N'-di(3-toly)-benzidine |
| BAlq | aluminum(III)bis(2-methyl-8-hydroxyquinolinato) 4-phenylphenolate |
| mCP | 1,3-N,N-dicarbazole-benzene |
| DCM | 4-(dicyanoethylene)-6-(4-dimethylaminostyryl-2-methyl)-4H-pyran |
| DMOA | N,N' -dimethylquinacridone |
| PEDOT:PSS | an aqueous dispersion of poly(3,4-ethylenedioxythiophene) with polystyrenesulfonate (PSS) |
| hfac | hexafluoroacetylacetonate |
| 1,5-COD | 1,5-cyclooctadiene |
| VTES | vinyltriethylsilane |
| BTMSA | bis(trimethylsilyl)acetylene |
| Ru(acac)$_3$ | tris(acetylacetonato)ruthenium(III) |

-continued

| Material Definitions and Abbreviations: | |
|---|---|
| C$_{60}$ | Carbon 60 ("Buckminsterfullerene") |
| FIr6 | bis-(4',6'-difluorophenylpyridinato)tetrakis(1-pyrazolyl)borate |
| PQIr | Ir(III)-bis-(2-phenylquinolyl-N,C$^{2'}$)-acetylacetonate |
| UGH2 | p-bis(triphenylsilyly)benzene |
| HTL | hole transporting layer |
| ETL | electron transporting layer |
| EML | emissive layer |
| CGL | charge generating layer |

EXPERIMENTAL

Specific representative embodiments of the invention will now be described, including how such embodiments may be made. It is understood that the specific methods, materials, conditions, process parameters, apparatus and the like do not necessarily limit the scope of the invention.

Example 1

The 20 Ω/sq indium tin oxide precoated glass substrates were degreased in detergent solution and cleaned by solvents, followed by treatment for ten-minute with UV/ozone before being transferred to a high vacuum of 10$^{-7}$ Torr. Then B, G, and R OLED sub-elements were sequentially deposited by thermal evaporation without breaking vacuum, with 10-nm BPhen layer doped with Li in a 1:1 molar ratio and a following 10-nm MoO$_3$ spaced in between each sub-element. Lithium, an n-type dopant here, is to add impurities to transfer electrons to LUMO states. For each OLED sub-element, a 40-nm film of 4,4'-bis[N-(1-naphthyl)-N-phenyl-amino]-biphenyl (NPD) as the HTL was deposited, followed by 25-nm EML, and then an ETL of 50-nm-thick BPhen. Here, BPhen, instead of 2,9-dimethyl-4,7-diphenyl-1,10-phenanthroline (BCP), is used to reduce device drive voltage. Also note that in order to maintain good charge balance at high bias when charge leakage is not effectively prevented by energy barriers, thicker-than-normal (50 nm) BPhen layers are deposited.

Blue, green and red emissions are obtained from the phosphorescent dopants of bis-(4',6'-difluorophenylpyridinato) tetrakis(1-pyrazolyl)borate (FIr6), tris-(phenylpyridine) iridium (Ir(ppy)$_3$), and Ir(III)-bis-(2-phenylquinolyl-N,C$^{2'}$)-acetylacetonate (PQIr), respectively. To optimize host materials for each of the dopants, dopant/host combinations are chosen as FIr6: p-bis-(triphenylsilyly)benzene (UGH2) for blue emission, Ir(ppy)$_3$: 4,4'-N,N-dicarbazole-biphenyl (CBP) for green, PQIr: 4,4'-N,N-dicarbazole-biphenyl (CBP) for red. Doping concentrations are controlled between 8 wt % to 10 wt % for each cell. Finally, the cathode consisting of LiF (0.8 nm) and Al (120 nm) was deposited with a shadow mask to define a device area of 1.0 mm diameter.

Figure 4:
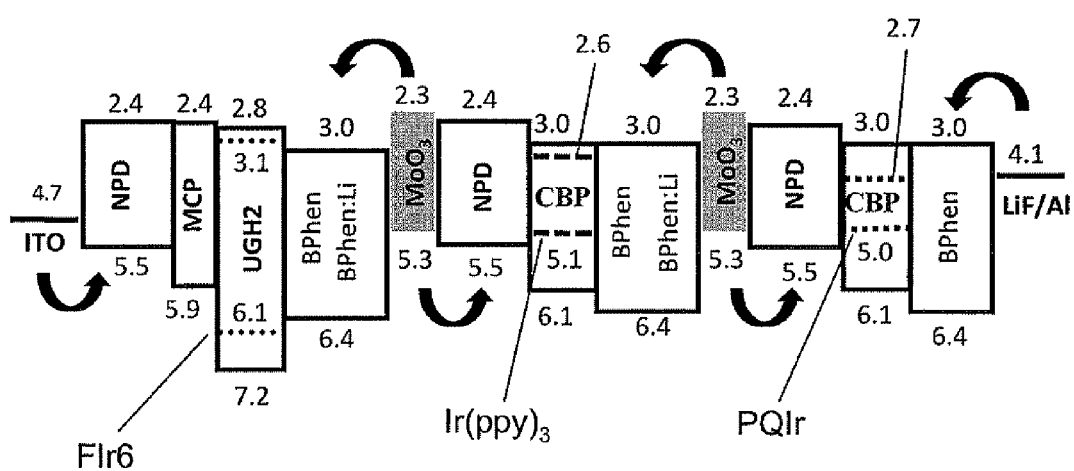
FIG. 4 shows the schematic energy level diagrams of the R-G-B WOLED of Example 1 consisting of red, green, and blue OLED sub-elements.

The luminance at a fixed current density increases approximately as the sum of that for each independent OLED cell. FIG. 4 shows the schematic energy level diagram of the R-G-B SOLED consisting of R, G, and B OLED cells. The numbers indicate the respective HOMO and LUMO energies relative to vacuum (unit in eV). The HOMO and LUMO energies of Fir6, Ir(ppy)$_3$ and PQIr are (6.1 eV, 3.1 eV), (5.1 eV, 2.6 eV) and (5.0 eV, 2.7 eV), respectively. The arrows indicate the carrier injection from electrodes and the MoO$_3$ charge-generation layers.

For balanced emission from each OLED element in order to achieve the desired white color performance, it may be important to control the weak microcavity effects in the stacked device. To optimize the structure, therefore, the extraction efficiencies of the R, G, and B cells in the stacked structure are calculated based on transfer matrix simulations. The complex refractive indices of organics, ITO and $MoO_3$ employed in the simulation are 1.7, 1.9−0.036·i and 1.9−0.3·i respectively. By varying the orders of three cells and the thickness of organic layers, the simulation shows that the power extracted into air is a function of both the wavelength and the source position (i.e., top, middle, and bottom, with bottom layer adjacent to ITO substrate). Results indicate that R, G, and B sub-elements, arranged in different orders, have different extraction efficiencies and thus yield different color temperature and color rending indices (CRI) of the stacked device with other parameters staying the same. By moving the three EMLs close to their corresponding optical antinodes, the order of B-G-R (with R adjacent to the ITO anode) leads to the optimal color balance, with Commission Internationale de L'Eclairage (CIE) coordinates (0.39, 0.42) and a color rendering index of CRI=79 at a current density of J=10 $mA/cm^2$, estimated to result in a luminance >1000 $cd/m^2$.

Figure 5:
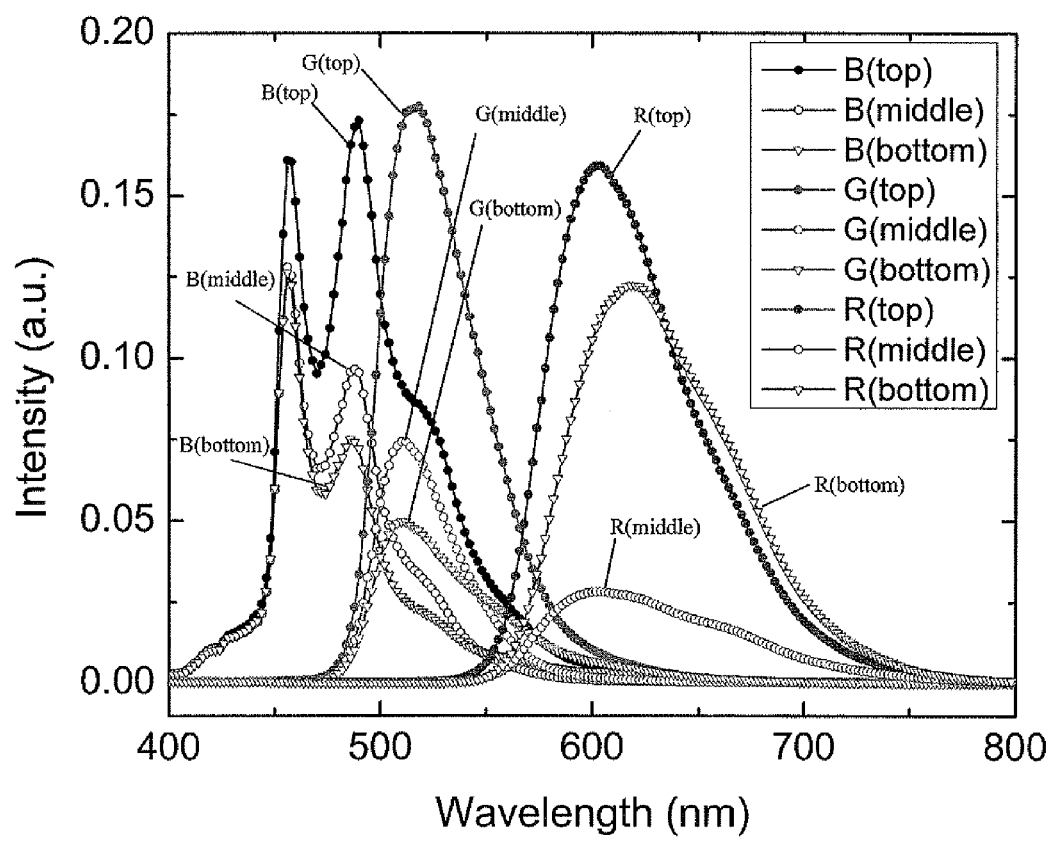
FIG. 5 shows the emission spectra for each sub-element as a function of its position in the stacked OLED structure.
Figure 11:
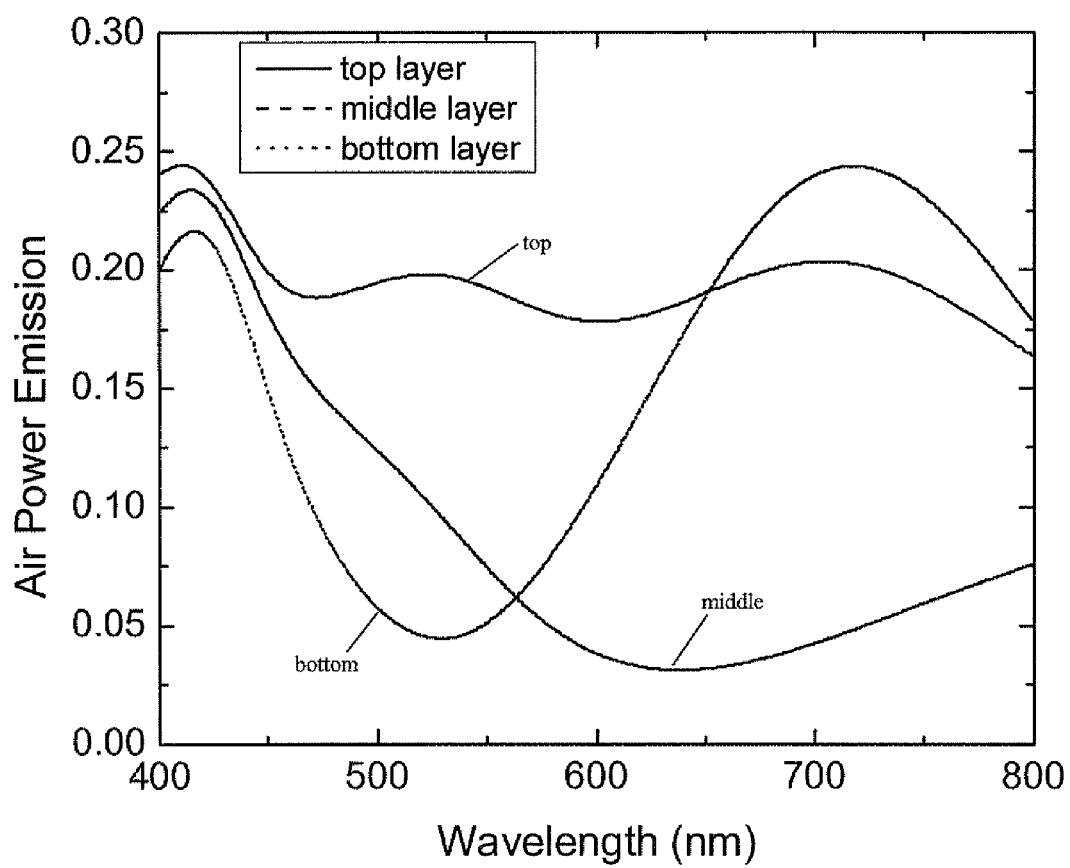
FIG. 11 shows the power extracted, considering microcavity effect as well as extraction efficiency, as a function of position and wavelength for the stacked OLEDs.

FIG. 5 shows the emission spectra for each sub-element as a function of its position in the stacked structure, with cavity enhancement and extraction efficiencies considered. FIG. 11 shows the shows the power extracted, considering microcavity effect as well as extraction efficiency, as a function of position and wavelength for the specific thickness of SOLED we use. With optimized doping concentrations, the configuration demonstrated above is one of the six order arrangement (RBG, RGB, etc) that gives the calculated Commission Internationale de L'Eclairage (CIE) coordinates and the CRI values (0.39, 0.42) and 79 at a current density of J=10 $mA/cm^2$, estimated to result in a luminance >1000 $cd/m^2$ under the assumptions that each cell has an IQE approaching unity, and the CGLs are efficient in generating holes and electrons.

Figure 6:
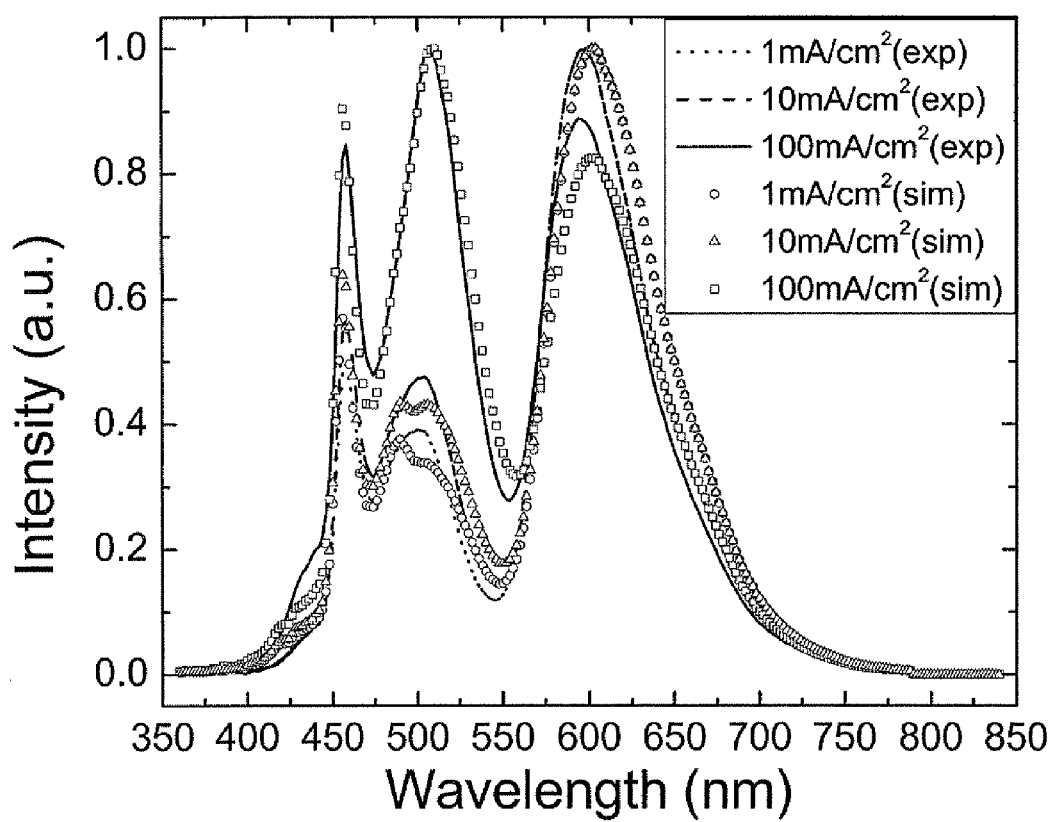
FIG. 6 shows the measured and simulated electroluminescence spectra for the device of Example 1 at current densities of J=1, 10, 100 mA/cm$^2$. The simulated spectra are based on cavity enhancement and extraction efficiencies by fitting ratios of photos generated from R, G, and B cells.
Figure 7:
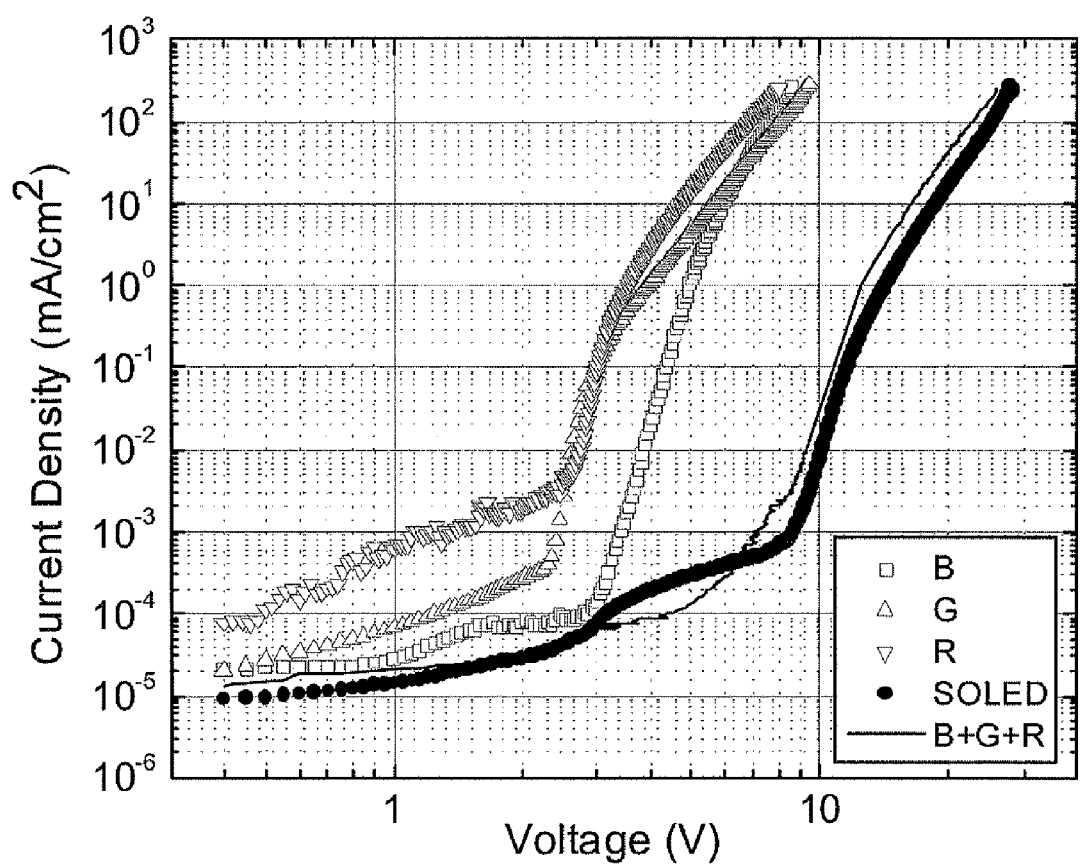
FIG. 7 shows the plots of current density versus voltage characteristics of the stacked OLED of Example 1 and control devices comprising the separate individual sub-elements.

FIG. 6 shows the experimental and simulated electroluminescence spectra for the device under different current densities (J=1, 10, 100 $mA/cm^2$). The CIE coordinates and the CRI values are (0.46, 0.36) and 61 at J=1 $mA/cm^2$, and (0.36, 0.37) and 78 at J=100 $mA/cm^2$, respectively. Simulated spectra are based on cavity enhancement and extraction efficiencies by fitting ratios of photons generated from each cell, with numbers shown in Table I. FIG. 7 compares the current density versus voltage characteristics of the stacked structure and control devices. The dashed line is the ideal J-V curve of the stacked device based on the J-V curve of the control devices without considering the voltage drop on the $MoO_3$ layers. There exists excess drive voltage on the SOLED compared with the sum of that on all three control devices (solid line). This effect, due to energy barriers at the CGL, accounts for a concomitant reduction of (10.3±0.7)% in power efficiency.

Figure 8:
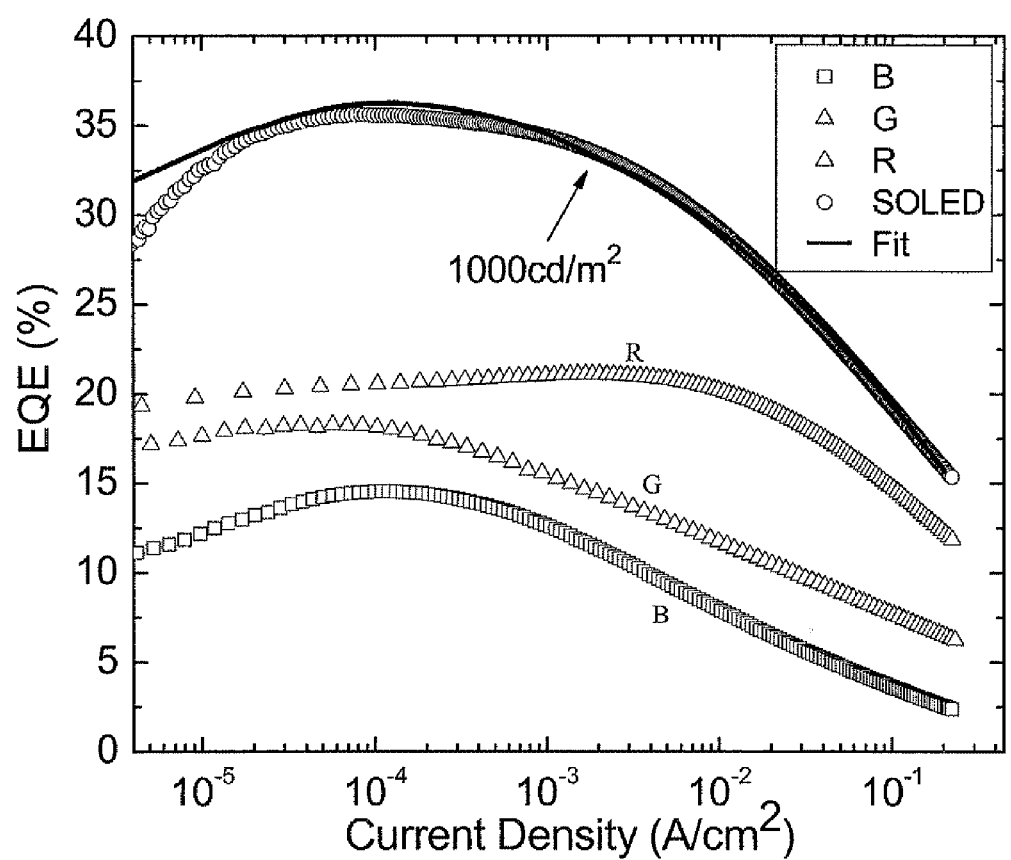
FIG. 8 shows the total external quantum efficiency as a function of current density for the R-G-B SOLED of Example 1 and for the individual red, green and blue control devices as a reference.
Figure 9:
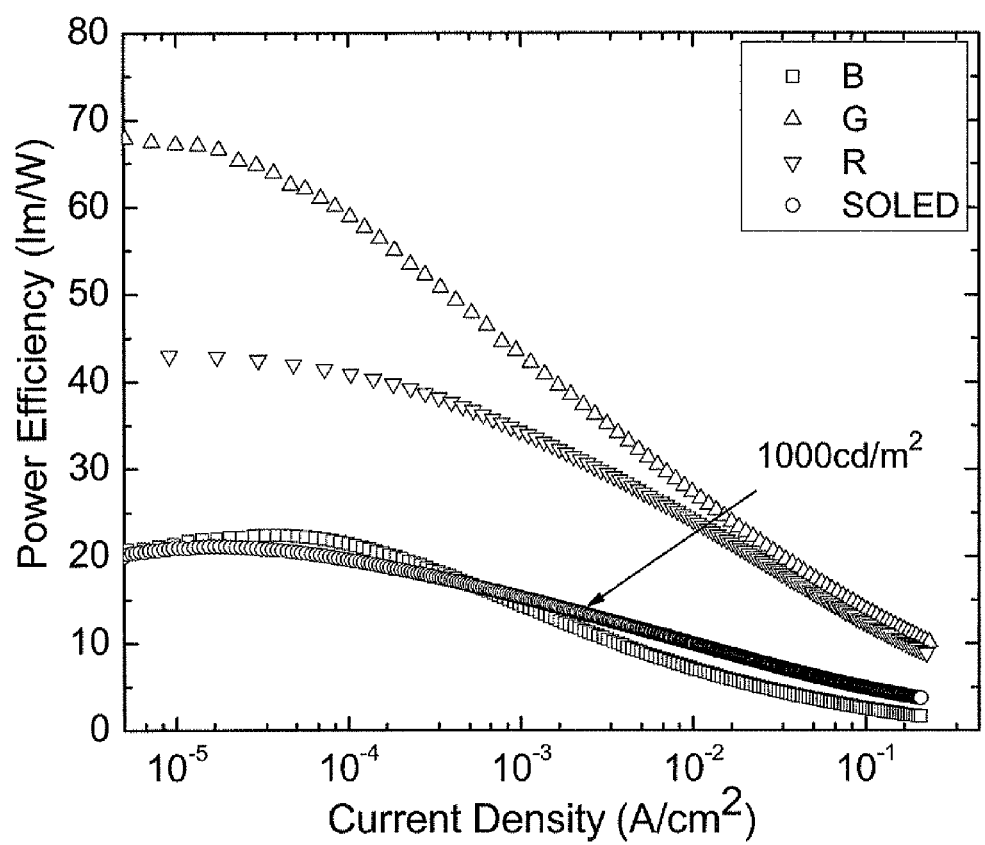
FIG. 9 shows the total power efficiency as a function of current density for the R-G-B SOLED of Example 1 and for the individual red, green and blue control devices as a reference. The arrow indicates values at brightness of 1000 cd/m$^2$.
Figure 10:
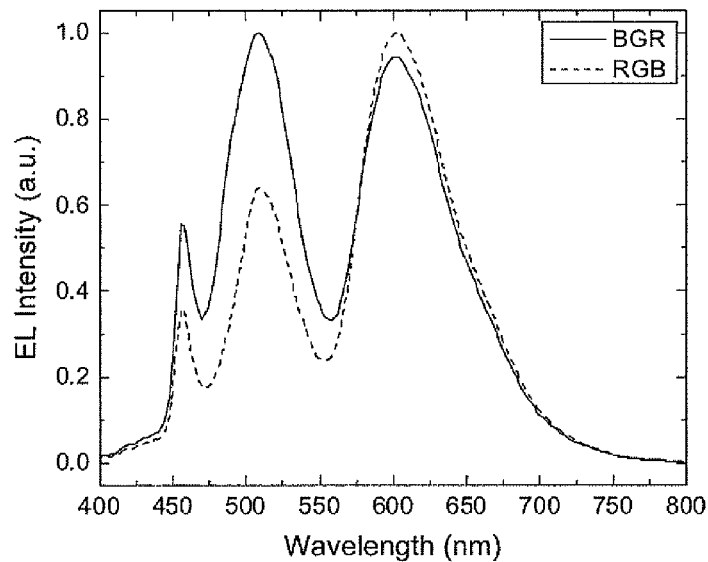
FIG. 10 shows the emission spectrum of the optically optimized stacked devices having the sub-element order B-G-R (solid line) and R-G-B (dashed line).
Figure 10:
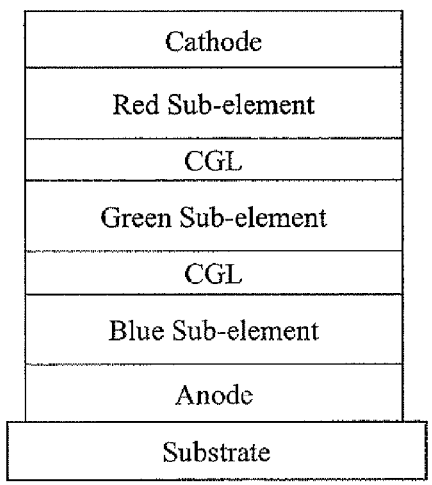
Figure 10:
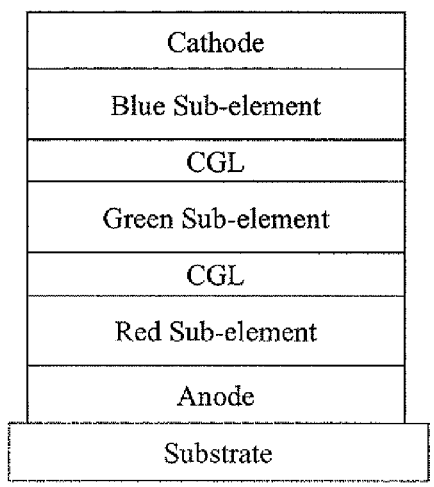

The external quantum and power efficiencies of the RGB SOLED, and the monochrome OLED control devices, measured in an integrating sphere, are shown in FIGS. 8 and 9. The blue, green and red controls exhibit EQEs peak at (13.9±1.0)%, (17.5±1.0)%, and (20.1±1.0)%, respectively. The total EQE and power efficiencies for the RGB SOLED have maxima at $\eta_{ext}$=(36±2)% at a current density of J=82 $\mu A/cm^2$, and $\eta_p$=(21±1) lm/W at J=17 $\mu A/cm^2$, respectively. These values roll off to (32±2)% and (13±1) lm/W at 1000 $cd/m^2$ corresponding to J=2 $mA/cm^2$. The maximum external efficiencies of the RGB SOLEDs are approximately the sum of the EQEs of the three individual elements over a wide range of current densities, indicating that the losses at the transparent CGL are minimal. A fit of the SOLED EQE is shown in solid line, yielding an emission intensity ratio 0.7: 0.5:1 in the B, G, and R elements. This dependence of exciton formation on position in the stack is attributed to the injection efficiencies of the CGLs and the ITO anode.

Table I provides the internal quantum efficiencies and the fraction of photons generated from the three stacked elements. As current densities increases, we observe an increase of exciton formation on the blue and green elements with respect to that of the red element. This indicates a current dependent electron and hole injection efficiency from the CGLs.

TABLE I

Internal quantum efficiencies and the ratio of photon generated from R, G, and B cells in stacked device.

| | Internal quantum efficiency | | | Ratio of photon generated [a] | | |
|---|---|---|---|---|---|---|
| | J = 1 | J = 10 | J = 100 | J = 1 | J = 10 | J = 100 |
| R (top) | 0.69 | 0.67 | 0.48 | 1.00 | 1.00 | 1.00 |
| G (middle) | 0.84 | 0.65 | 0.42 | 0.45 | 0.64 | 2.22 |
| B (bottom) | 0.52 | 0.33 | 0.15 | 0.73 | 0.82 | 1.44 |

[a] Numbers are in arbitrary unit, normalized to the value of red devices under respective current densities.

Among the components of power efficiency for R-G-B SOLED, electrical efficiency, defined as $V_\lambda/V$, is important for improvement in power efficiency. Note that $V_\lambda$ is emissive photon energy in eV and V is the operating voltage at a certain current density. The electrical efficiency of the SOLED drops from 0.14 at J=1 $mA/cm^2$ to 0.09 at J=100 $mA/cm^2$, compare to 0.25, 0.38, and 0.28 for the B, G, and R control devices, respectively, at the same current density. It can be increased by improving charge transport, and charge injection particularly from CGLs.

In summary, the R-G-B SOLEDs fabricated with all phosphorescent emitters and using a transparent CGL such as $MoO_3$/Li:BPhen show improved the device performance. White emission and SOLED efficiency were optimized by making a tradeoff between the color emissive element ordering to achieve efficient charge injection and a maximum outcoupling efficiency at a high CRI. The device reaches a maximum total external quantum and power efficiencies of $\eta_{ext}$= (36±2)% and $\eta_p$=(21±1) lm/W, respectively. These results demonstrate electrophosphorescent RGB SOLEDs represent a promising architecture for achieving high brightness and efficiency for indoor lighting.

Example 2

To further understand and optimize the CGL architecture, the charge generation in CGLs based on transparent metal oxides was systematically studied. The current density-voltage (J-V) and capacitance-voltage (C-V) characteristics was analyzed for electron- and hole-only devices consisting of $MoO_3$ layers with varying thicknesses, and over a wide range of temperature. Optimized performance of a LiBCP/$MoO_3$ CGL is demonstrated by varying both the thickness of $MoO_3$, as well as the Li doping ratio in BCP. Thermally assisted tunneling from a trap level at (0.06±0.01) eV above the $MoO_3$ valence band maximum into the adjacent organic layer is proposed to explain the temperature dependence of the J-V characteristics in both electron- and hole-only devices.

Both the electron- and hole-only devices were prepared on detergent and solvent cleaned glass substrates that were immediately transferred into a vacuum chamber with a base pressure of $10^{-7}$ Torr after a 10-minute exposure to a UV/ozone treatment. For the electron-only device shown in FIG. 13a, a 50 nm-thick Al cathode to minimize hole injection was deposited onto the glass substrate through a 1 mm-wide striped shadow mask. This was followed by the deposition of a 40 nm-thick layer of BCP and a 10 nm-thick Li-doped layer of BCP in a 1:1 molar ratio. On this surface, a layer of $MoO_3$, of different thicknesses (5,10, and 20 nm) was deposited, followed by a second 50 nm-thick Al cathode deposited through 1-mm-wide striped shadow mask positioned perpendicular to the anode stripes. Similarly, for the hole-only device (see FIG. 13b), a 50 nm-thick Al electrode was deposited onto the glass substrate, followed by the deposition of a 10 nm-thick Li-doped BCP with 1:1 molar ratio, and $MoO_3$, of varied thicknesses (0, 5, 10, and 20 nm). Then a 40 nm-thick 4,4'-bis[N-(1-naphthyl)-N-phenyl-amino]-biphenyl (NPD) layer was deposited as a hole transport layer (HTL), followed by a 50 nm-thick $MoO_3$, electron blocking layer (EBL), and capped by a 50-nm thick Al cathode.

The ionization potentials and work functions used in the energy level diagrams have been taken from the literature. A work function of 5.7 eV was used for $MoO_3$.

For characterization, samples were mounted in a cryostat where the temperature was varied from 159K to 296K, and J-V characteristics were measured using a parameter analyzer (HP 4145B). The C-V measurements employed an impedance/gain-phase analyzer (HP 4194A), from which was inferred the free carrier concentration and position of the interface barrier. The C-V measurements were obtained at a frequency of 200 Hz, which is sufficiently low to allow for dielectric relaxation. Optical characterization of the devices employed a calibrated detector reference using standard methods described previously. (S. R. Forrest, D. D. C. Bradley and M. E. Thompson, *Adv. Mater.* 2003, 15, 1043).

Figure 14:
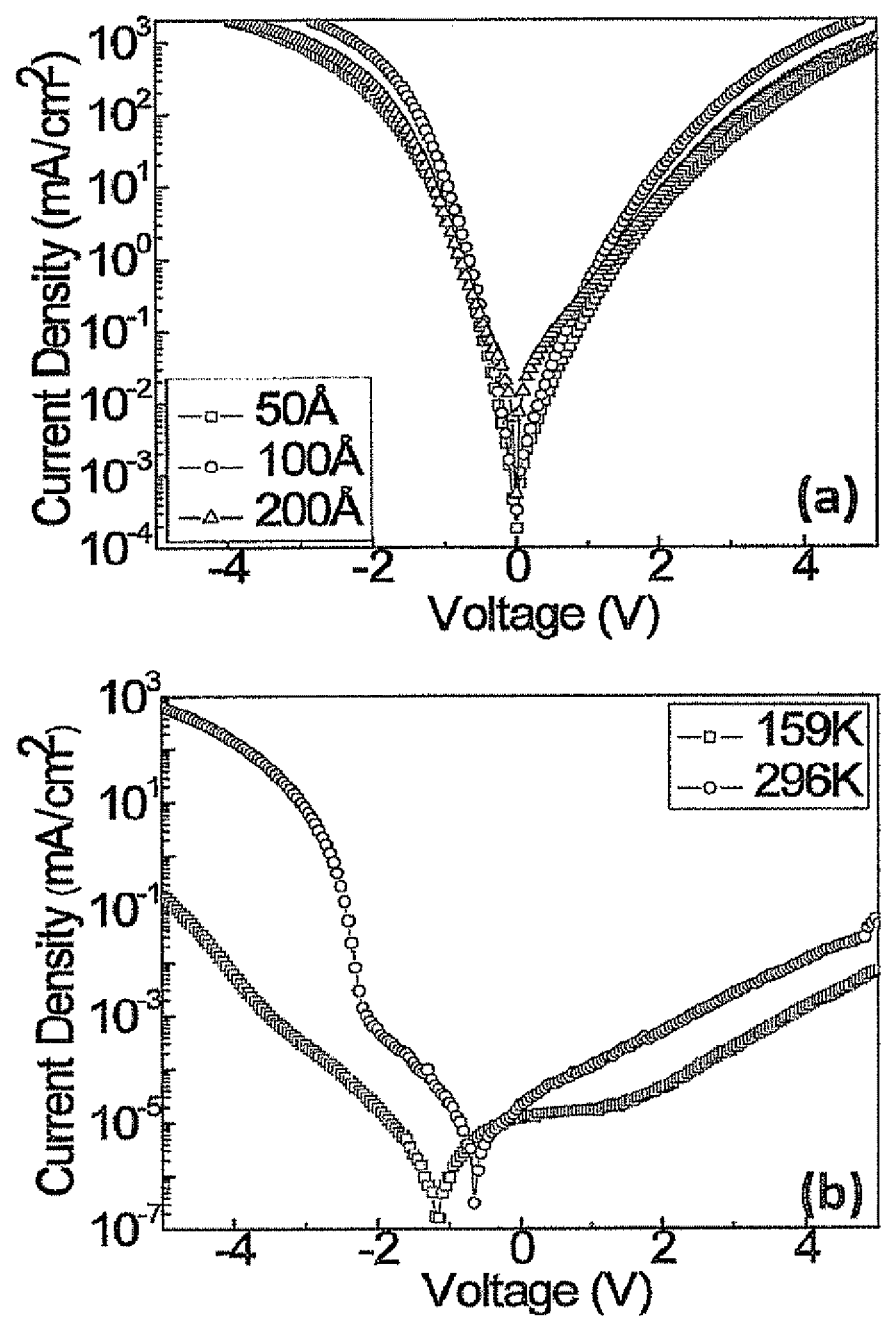
FIG. 14 shows (a) the room-temperature J-V characteristics of the electron-only devices with MoO$_3$ of the thickness 50 Å (square), 100 Å (circle), and 200 Å (triangle); and (b) the J-V characteristics of the hole-only device without MoO$_3$ (Al 500 Å/Li:BCP 100 Å/NPD 400 Å/MoO$_3$ 50 Å/Al 500 Å) under 159K (open square) and 296K (open circle).

The room temperature J-V characteristics of the electron-only device with $MoO_3$ thicknesses of 50 Å, 100 Å and 200 Å, are shown in FIG. 14a. For electron injection, the Al electrode on the BCP side is positively biased relative to the Al electrode on the $MoO_3$ side. The lack of rectification of the J-V characteristics indicates nearly equally efficient electron injection from the CGL and the cathode. Under forward bias (V>0), a dependence on $MoO_3$ thickness is observed, with 100 Å being the optimized thickness for the electron-only devices. FIG. 14b shows the hole-only device with no $MoO_3$ introduced, the current densities at a given forward bias are reduced with the temperature ranging from 296K to 159K, and a rectification ratio of ~$10^4$ at ±5V is observed at room temperature.

Figure 15:
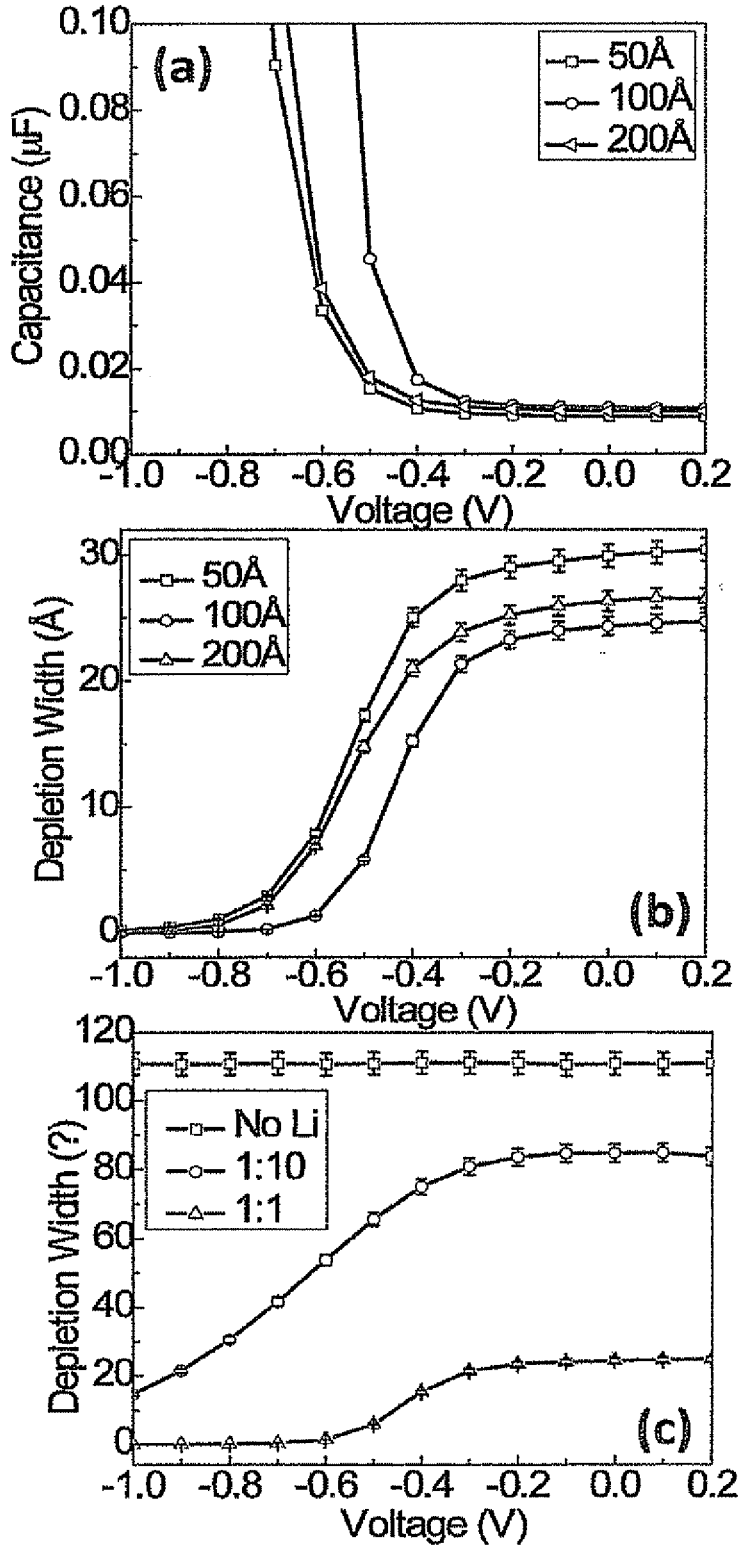
FIG. 15 shows (a) the C-V characteristics; (b) the calculated depletion widths of the electron-only devices with MoO$_3$ of the thickness 50 Å (square), 100 Å (circle), and 200 Å (triangle) at the frequency of 200 Hz; and (c) the calculated depletion widths of the electron-only devices with 100-Å-thick MoO$_3$ with Li:BCP in a 1:10 molar ratio (circle), and Li:BCP in a 1:1 molar ratio (triangle), and without Li doping (square).

The C-V characteristics of the electron-only devices are shown in FIG. 15a. Depletion layer widths calculated from the capacitance are shown in FIG. 15b. In FIG. 15c, the effect of different free carrier concentrations on interface depletion width is demonstrated for CGLs with a 100 Å-thick layer of $MoO_3$. The concentration of Li in BCP is varied from 1:1 to 1:10 molar ratio, corresponding to depletion widths of 24 Å and 85 Å, respectively. The device without Li doping shows a fully depleted region with a thickness of 110 Å.

Figure 13:
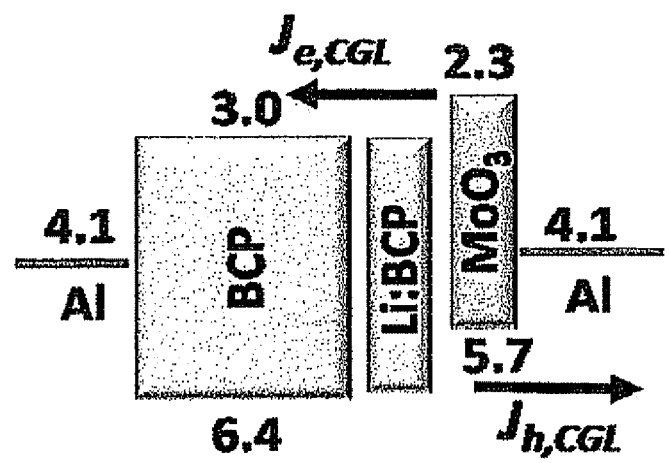
FIG. 13 shows the proposed energy-level diagrams of the (a) electron-, and (b) hole-only devices.
Figure 13:
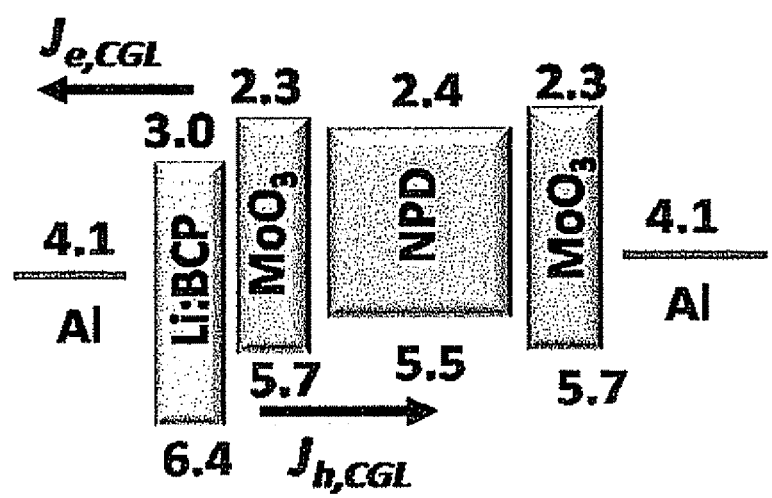
Figure 17:
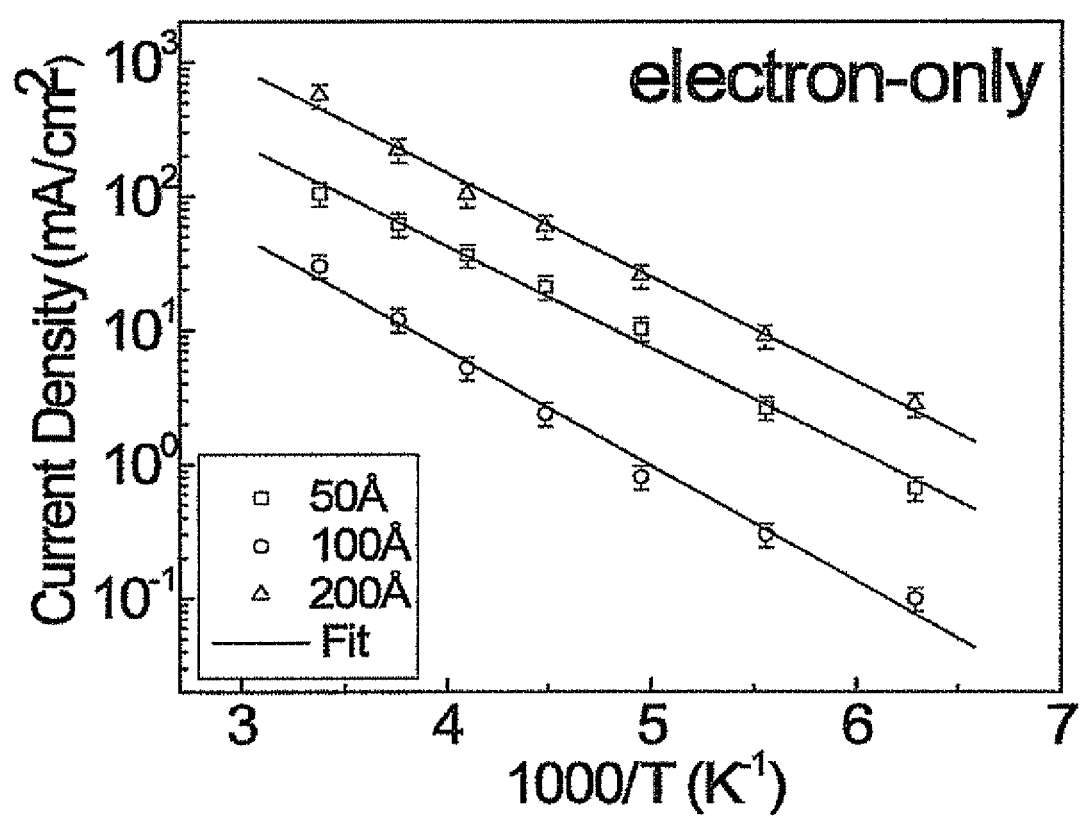
FIG. 17 shows the current density (J) vs. 1000/T, where T is the temperature, for electron-only devices at an applied electric field E=2.0×10$^7$ V/cm, except for the device with 200 Å-thick MoO$_3$, in which E=2.6×10$^7$ V/cm is used. Solid line fits yield the trap energy level, $\Phi_t$, listed in Table I.
Figure 18:
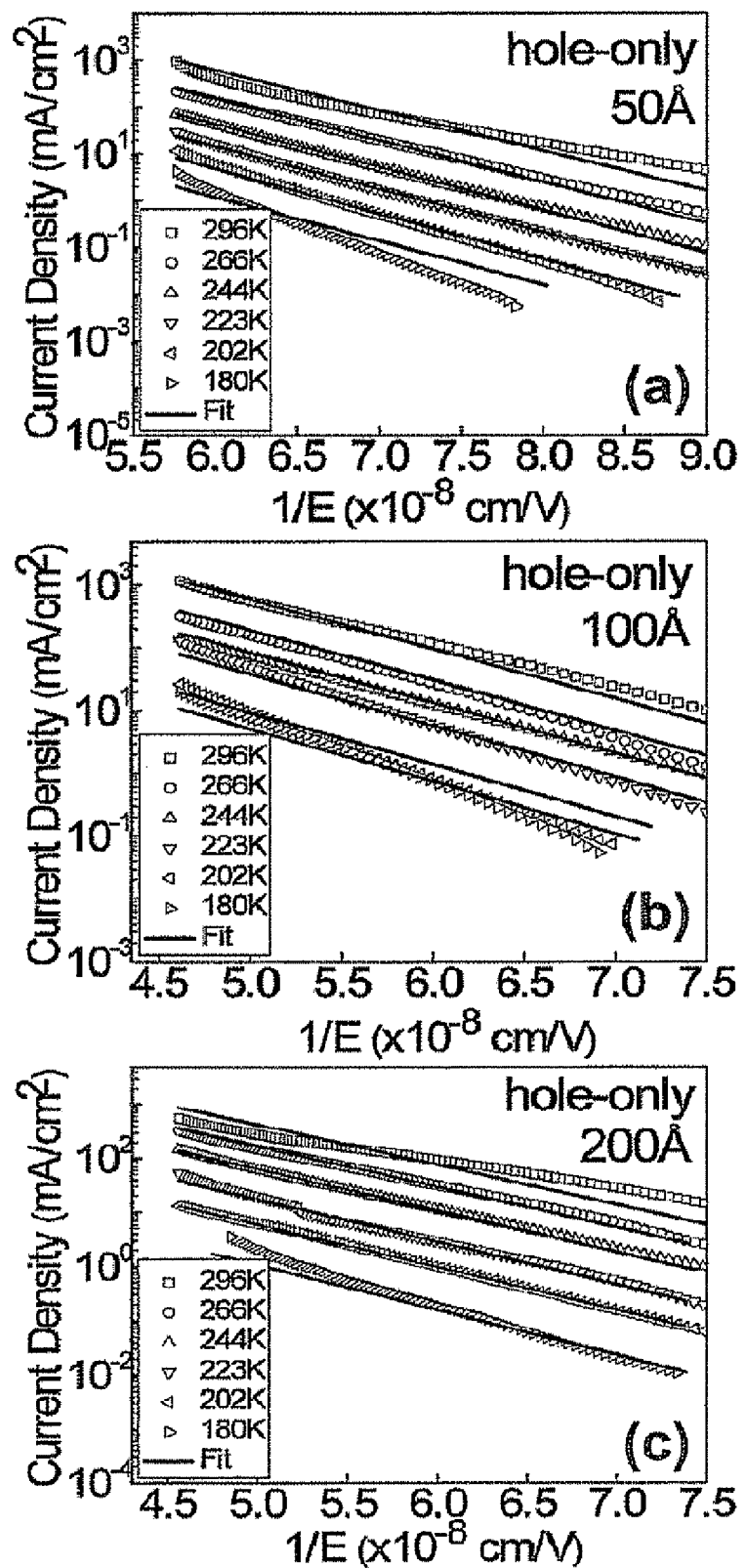
FIG. 18 shows the current density (J) vs. inverse electric field (E) for hole-only devices with MoO$_3$ thickness of (a) 50 Å, (b) 100 Å and (c) 200 Å under temperatures varied from 180K to 296K. The solid lines are fits according to Eqs. (1) and (2) to yield both the tunneling and trap energy barriers listed in Table I.
Figure 19:
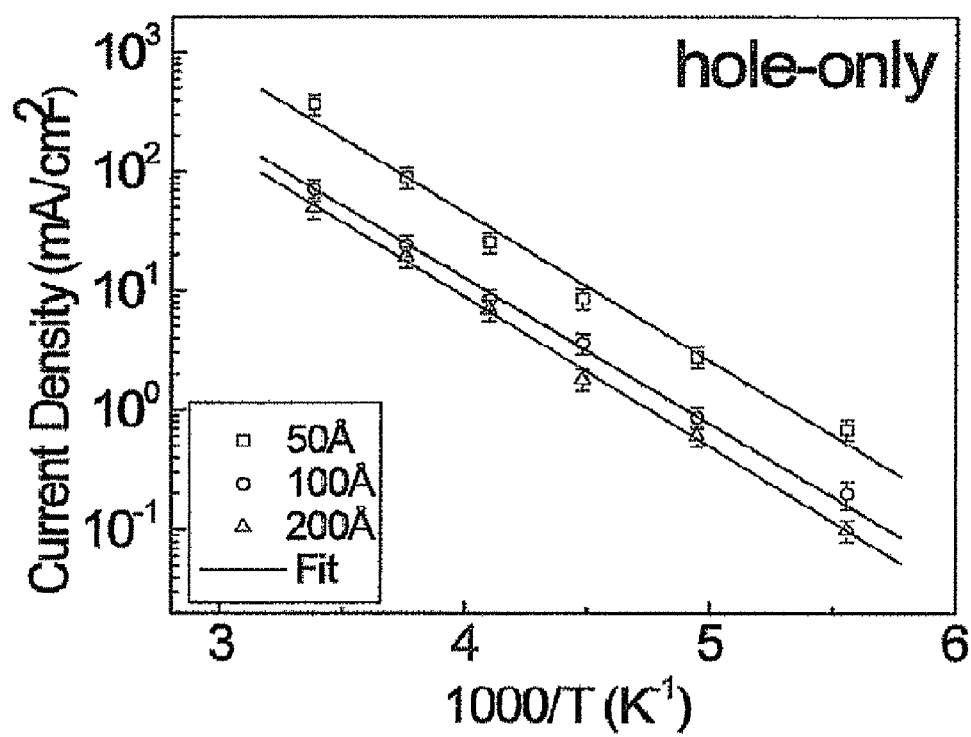
FIG. 19 shows the current density (J) vs. 1000/T, where T is the temperature, for hole-only devices at an applied electric field E=1.6×10$^7$ V/cm. Solid line fits yield the trap energy level, $\Phi_t$, listed in Table I.

The current densities as functions of 1/E(V) for various temperatures ranging from 159K to 296K are plotted for electron-only (FIG. 16) devices shown in FIG. 13a. Here, the electric field is taken as the ratio of the applied voltage to the charge generation layer thickness, after subtracting the 2.7V built-in potential. Small voltage drops at the contact/organic layer interface and across the highly Li-doped layers are neglected. In FIG. 17, the current densities J vs. 1000/T are plotted for an electric field E=2.0×$10^7$ V/cm, which we obtain the trap activation energy $\Phi_t$. Corresponding plots for hole-only devices are shown in FIGS. 18 and 19, respectively.

The presence of a $MoO_3$ layer is important for efficient charge generation, as shown by comparison of FIGS. 14a and 14b. Under reverse bias, both Al contacts are nearly ohmic due to the high Li concentration in BCP, as well as due to the 50 Å-thick $MoO_3$ between the NPD and the Al cathode which, in combination, enhance hole injection. Under forward bias, however, both electron and hole injection are reduced at the electrodes, and the current density is a result of carrier generation from the CGL. With efficient injection and transport facilitated for both electrons and holes under both reverse and forward biases, symmetric J-V characteristics are observed for electron-only devices with various $MoO_3$ thicknesses, as shown in FIG. 14a. Among the CGLs with varied thicknesses of $MoO_3$, the device with a 100 Å-thick CGL shows a high generation efficiency, with a current three to four times higher than for 50 Å and 200 Å-thick $MoO_3$ layers at >2V under forward bias. The $MoO_3$ is too thin to result in complete and uniform coverage at 50 Å, hence reducing injection at this interface, while at thicknesses >100 Å, tunneling injection is significantly attenuated.

The J-V characteristics of the hole-only devices yield a similar dependence on $MoO_3$ thickness. Shown in FIG. 14b are the J-V characteristics of a hole-only device without $MoO_3$, with the structure Al (500 Å)/Li:BCP (100 Å)/NPD (400 Å)/$MoO_3$ (50 Å)/Al (500 Å). Here the 50 Å-thick $MoO_3$ adjacent to Al cathode acts as an EBL. Inefficient carrier generation was observed under forward bias due to the absence of $MoO_3$, resulting in a rectification ratio of ~$10^4$ at ±5V at room temperature. The hysteresis behavior at 159K, shown in FIG. 14b where zero current occurs at −1.2V for voltage swept from −5 to 5V, is possibly due to electron capture and delayed re-emission at defect states in $MoO_3$ introduced during film deposition.

To understand the thickness dependence of the charge carrier generation efficiency, C-V measurements for the electron-only devices are shown in FIG. 15a. The depletion widths in the doped BCP layer, are 30 Å, 24 Å and 26 Å for CGLs with $MoO_3$ thicknesses of 50 Å, 100 Å and 200 Å, respectively (FIG. 15b). The relative static permittivity used to determine the carrier concentration is 3.0 for the organic layers. In the case of 1:1 Li:BCP, the electron concentration in BCP is calculated to be $N_d$=$10^{19}$~$10^{20}$ $cm^{-3}$ as inferred from the depletion width of 24 Å. This is in agreement with the 1:1 molar ratio of Li:BCP doping concentration, suggesting one electron per Li atom. The estimation of $N_d$ is significantly larger than previously reported (~$10^{18}$ $cm^{-3}$) from conductivity measurements, where the formation of a BCP-Li complex was suggested to explain the difference of Li doping concentration and the carrier density of the doped film. The doped BCP layer ensures a very thin depletion layer that allows for efficient electron injection. Since the tunneling probability is an exponential function of tunneling distance, the 100 Å-thick $MoO_3$ sample results in the highest tunneling injection efficiency compared to the other thicknesses used.

Figure 16:
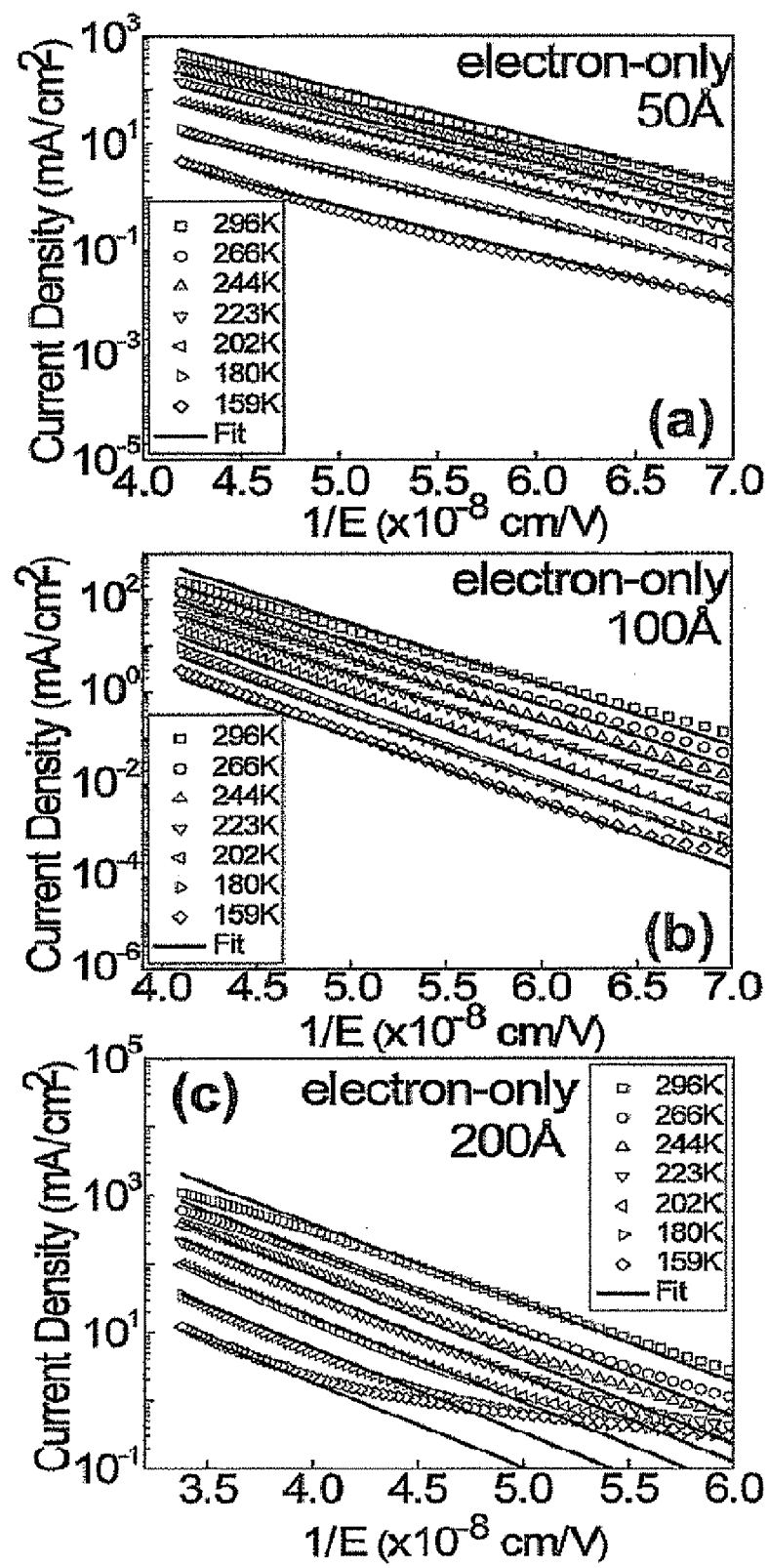
FIG. 16 shows the current density (J) vs. inverse electric field (E) for electron-only devices with MoO$_3$ thickness of (a) 50 Å, (b) 100 Å and (c) 200 Å under temperatures varied from 159K to 296K. The solid lines are fits according to Eqs. (1) and (2) to yield both the tunneling and trap energy barriers listed in Table I.

To extract energy barrier $\Phi_B$, the J vs. $E^{-1}$ characteristics of the electron-only devices with various $MoO_3$ thicknesses are plotted in FIG. 16, where E is calculated by subtracting the built-in potential, 2.7V, from the applied voltage. Since Li:BCP and $MoO_3$ are highly doped n-type and p-type semiconductor materials, respectively, the built-in potential at the Li:BCP/$MoO_3$ junction is determined by the difference between BCP LUMO (3.0 eV) and $MoO_3$ valence band maximum (5.7 eV). Linear relationships in log(J) vs. $E^{-1}$ are observed for devices in the temperature range from 296K to 159K. Energy barriers, $\Phi_B$, obtained from the fit of Eq. (1) to these data are listed in Table II.

To extract the trap activation energy, $\Phi_t$, the current densities J vs. 1000/T for these same data are plotted in FIG. 17. The slopes of the fits (solid lines) yield $\Phi_t$=(0.06±0.01) eV independent of $MoO_3$ thickness. The intercepts yield the value, $qv_eN_t$-$10^6$ A/cm$^2$. Taking the electron thermal velocity of $v_e$-$10^7$ cm/s, we obtain a trap concentration $N_t$~$10^{18}$/cm$^3$, as listed, in Table II.

Similar plots for hole-only devices are shown in FIGS. 18 and 19. The electric field within the CGL is more complicated to estimate than for electron-only devices due to the voltage drop across the undoped NPD. Hence, we fabricated the following device: ITO (1500 Å)/NPD (400 Å)/MoO$_3$ (100 Å)/Al (500 Å) to determine the E. From these data, we obtain $\Phi_B$ and $\Phi_t$, with the results also presented in Table II. Agreement between the energies and trap densities obtained for both the electron- and hole-only devices provides significant support for this model.

TABLE II

Tunneling barrier, $\phi_B$, and trap depth, $\phi_t$, and trap density, $N_t$, of electron- and hole-only devices with MoO$_3$ thickness.

| Devices | | 50 Å | 100 Å | 200 Å |
|---|---|---|---|---|
| electron-only | $\phi_B$ (eV) | 1.1 ± 0.1 | 1.3 ± 0.1 | 1.2 ± 0.1 |
| | $\phi_t$ (eV) | 0.07 ± 0.01 | 0.06 ± 0.01 | 0.06 ± 0.01 |
| | $N_t$ (×10$^{-18}$ cm$^{-3}$) | 1.2 ± 0.8 | 12.5 ± 7.3 | 2.5 ± 1.4 |
| hole-only | $\phi_B$ (eV) | 1.1 ± 0.1 | 1.0 ± 0.1 | 1.0 ± 0.1 |
| | $\phi_t$ (eV) | 0.08 ± 0.02 | 0.09 ± 0.02 | 0.09 ± 0.02 |
| | $N_t$ (×10$^{-18}$ cm$^{-3}$) | 15.7 ± 9.2 | 9.9 ± 5.8 | 3.1 ± 1.9 |

Example 3

To determine the effects of the charge generation efficiency on the performance of a green emitting SOLED with more than two sub-elements, OLEDs using the CGL as either a cathode (Cell-L), an anode (Cell-R), or both (Cell-M) were fabricated (see FIG. 20*a*), as well as the control device with an ITO anode/Al cathode combination. Detailed structures are provided in Table III. Note that for Cell-R and Cell-M, 20 Å-thick Al was directly deposited onto ITO to ensure band alignment at the metal/organic interface, and thus to decrease the significant energy barrier that prevents electron transport from the CGL to ITO.

TABLE III

Structure of the subcells in a 3 layer SOLED, and the control OLED.

| Devices | Layer Functions | Materials | Thicknesses (Å) |
|---|---|---|---|
| Cell-L | anode | ITO | 1500 |
| | HTL | NPD | 400 |
| | EML | Ir(ppy)$_3$:CBP | 250 |
| | ETL | BCP | 500 |
| | CGL | Li:BCP/MoO$_3$ | 100/100 |
| | cathode | Al | 500 |
| Cell-M | anode | ITO/Al | 1500/20 |
| | CGL | Li:BCP/MoO$_3$ | 100/100 |
| | HTL | NPD | 400 |
| | EML | Ir(ppy)$_3$:CBP | 250 |
| | ETL | BCP | 500 |
| | CGL | Li:BCP/MoO$_3$ | 100/100 |
| | cathode | Al | 500 |
| Cell-R | anode | ITO/Al | 1500/20 |
| | CGL | Li:BCP/MoO$_3$ | 100/100 |
| | HTL | NPD | 400 |
| | EML | Ir(ppy)$_3$:CBP | 250 |
| | ETL | BCP | 400 |
| | cathode | LiF/Al | 8/500 |

TABLE III-continued

Structure of the subcells in a 3 layer SOLED, and the control OLED.

| Devices | Layer Functions | Materials | Thicknesses (Å) |
|---|---|---|---|
| control | anode | ITO | 1500 |
| | HTL | NPD | 400 |
| | EML | Ir(ppy)$_3$:CBP | 250 |
| | ETL | BCP | 400 |
| | cathode | LiF/Al | 8/500 |

Figure 20:
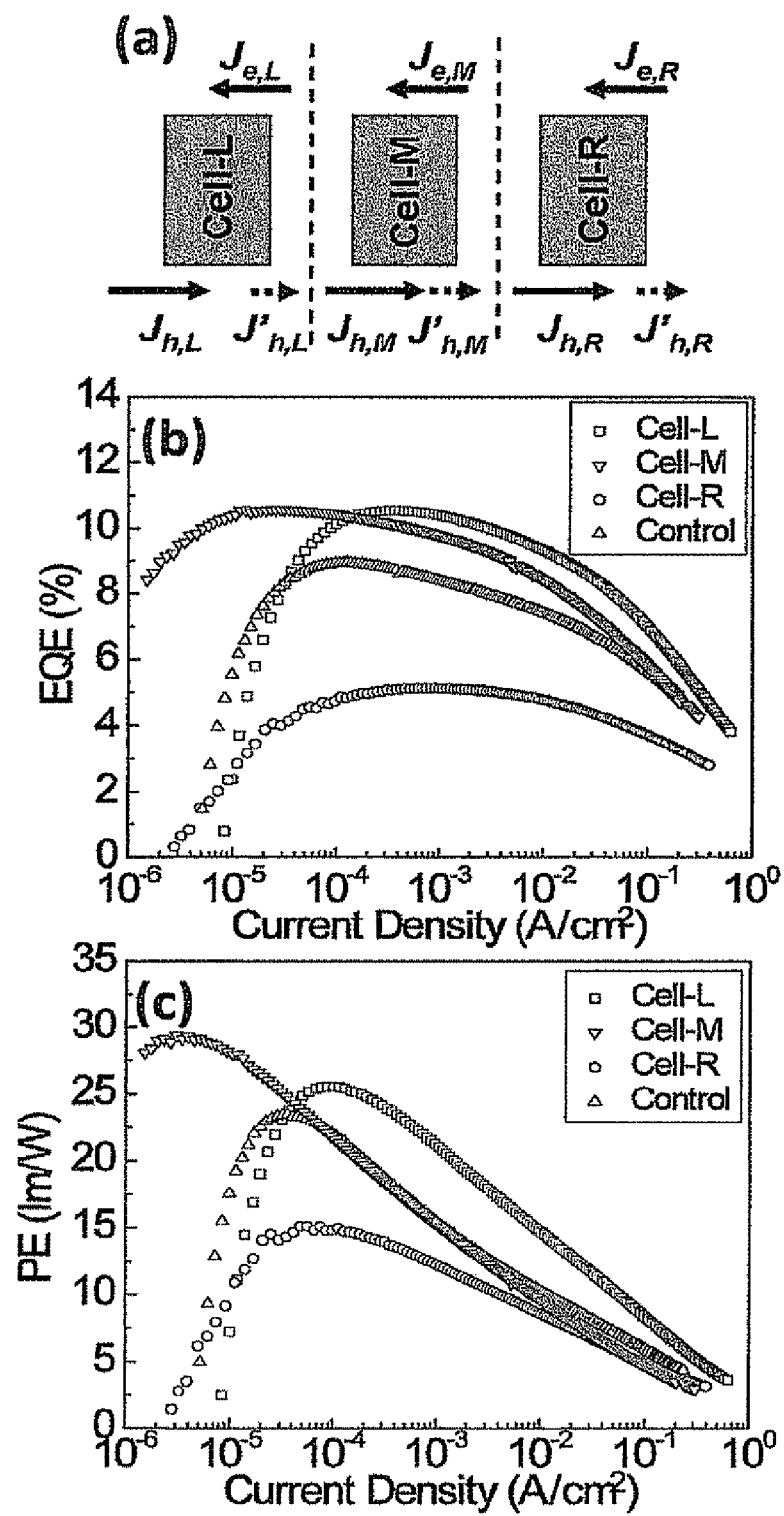
FIG. 20 shows (a) the schematic of the currents that establish charge balance in a SOLED with three subelements, wherein the directions of current densities are indicated by arrows and parasitic leakage currents are indicated by dashed lines; (b) the external quantum efficiencies and (c) power efficiencies of Cell-L (open square), Cell-M (inverted triangle), Cell-R (open circle), and the control device (triangle).

The EQE and PE of each device are shown in FIGS. 20*b* and 20*c*. The control device shows a peak forward-viewing EQE=(8.9±0.2)% at current density J=0.13 mA/cm$^2$, similar to previously reported Ir(ppy)$_3$-based electrophosphorescent OLEDS. A peak forward viewing EQE=(10.5±0.2)% is observed for Cell-L at J=0.37 mA/cm$^2$, and EQE=(10.6±0.2)% at J=39 μA/cm$^2$ for Cell-M. In contrast, Cell-R shows a significantly reduced peak EQE=(5.3±0.2)% at a current density of J=0.92 mA/cm$^2$. The PE for Cells-L, -M, and -R have maxima of (26±1), (29±1), and (15±1) lm/W, respectively, compared to PE=(23±1) lm/W for the control device.

To achieve high efficiency and brightness, CGLs preferably also provide for charge balance in each emitting element when used as connecting electrodes in SOLEDs, as suggested by Eqs. (3) and (4). For devices in FIG. 20*a*, no NPD emission is observed as a function of current density, and hence we infer that the devices are hole-rich. The improved electron transport to the EML achieved by the CGL in Cell-L leads to an enhanced EQE. In contrast, hole leakage through Cell-R results in charge imbalance and an EQE, that is considerably less than that of Cell-L, -M and the control OLED. Note that optical interference effects introduced by CGLs and the thin Al layers in all three cells have been calculated based on transfer matrix simulations, leading to only a small (3%) effect on the power efficiencies, and hence cannot be the cause of the reduced EQE of Cell-R.

Comparing the efficiency of the control device with those of each sub-element in the stack, we obtain the following charge balance fractions for Cells-L, -M, and -R (c.f. FIG. 20*a*):

$$\gamma_{Cell-L} = \frac{J_{h,L} - J'_{h,L}}{J_{h,L}} = \frac{10.5\%}{EQE_{max}}, \quad (5a)$$

$$\gamma_{Cell-M} = \frac{J_{h,M} - J'_{h,M}}{J_{h,M}} = \frac{10.1\%}{EQE_{max}}, \quad (5b)$$

$$\gamma_{Cell-R} = \frac{J_{h,R} - J'_{h,R}}{J_{h,R}} = \frac{5.1\%}{EQE_{max}}, \quad (5c)$$

Under charge neutrality at both electrodes, we have:

$$J_{h,L} = J_{e,R} + J_{h,R} = J_{max} \approx 0.4 \text{mA/cm}^2. \quad (5d)$$

Equations (5a-5d) then give $\gamma_{Cell-L}$=1, $\gamma_{Cell-M}$=0.96, and $\gamma_{Cell-R}$=0.49, suggesting nearly unity charge balance in the two former cells. However, in Cell-R, there is a large hole-current imbalance of $J_{h,R}$=0.19 mA/cm$^2$, whose presence results in the significantly reduced EQE of that sub-element.

Figure 21:
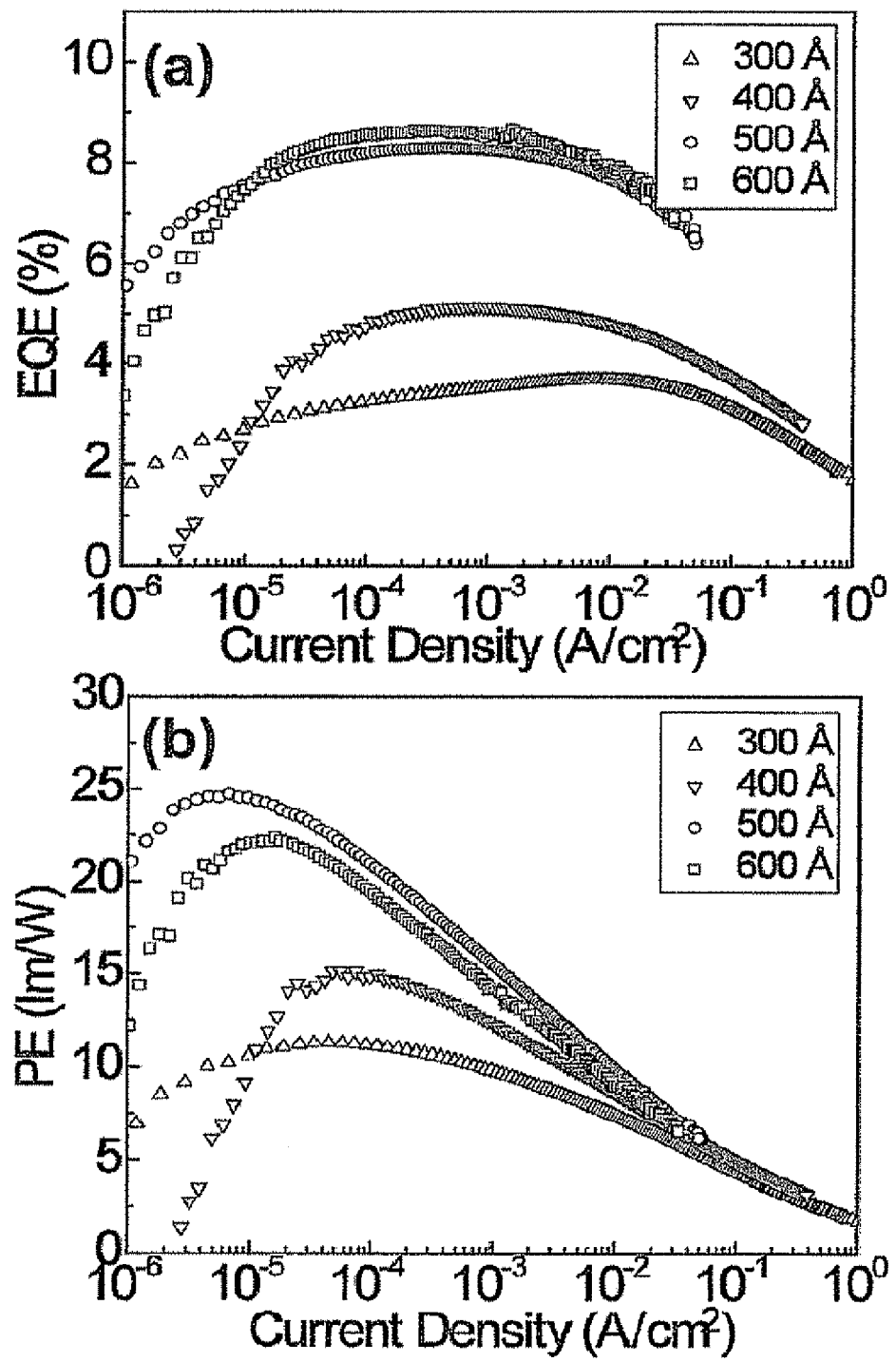
FIG. 21 shows (a) the external quantum efficiencies and (b) the power efficiencies of Cell-R with various BCP thicknesses.

To optimize Cell-R, the hole current was controlled by using various thicknesses of BCP, ranging from 300 Å to 600 Å. As shown in FIG. 21, peak EQEs of (3.7±0.2)%, (5.1±0.2)%, (8.3±0.2)%, and (8.6±0.2)% are observed for BCP thicknesses of 300 Å 400 Å, 500 Å and 600, respectively. The corresponding power efficiencies have maximum values of (11±1) lm/W, (15±1) lm/W, (24±1) lm/W, and (22±1) lm/W. Increased EQEs and PEs are observed for the devices with BCP thicknesses of 500 Å and 600 Å. Thus, by changing only the transport layer thickness (and hence its resistance), we can significantly improve cell efficiency, which supports the conclusion that charge imbalance in Cell-R is the primary mechanism for efficiency loss. Of the various means of achieving charge balance, ohmic hole and electron injection into the EML may be optimal. Hence, employing charge blocking layers as opposed to increasing layer resistance (as done here) provides the highest combination of PE and EQE for each element in the stack.

Figure 22:
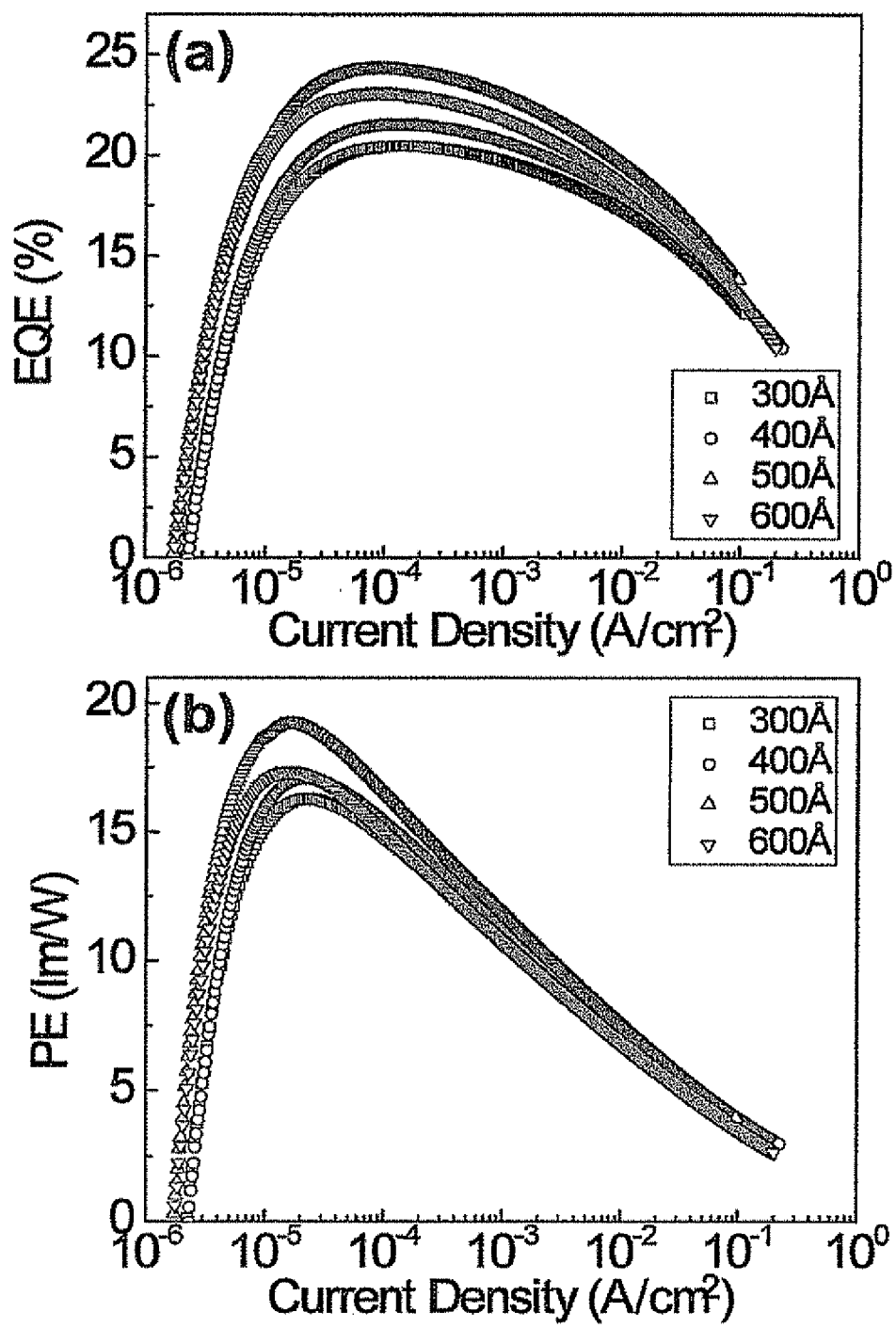
FIG. 22 shows (a) the external quantum efficiencies and (b) the power efficiencies of G-G-G SOLEDs with various BCP thicknesses in Cell-R.

The EQEs and PEs of the G-G-G SOLEDs with varied BCP thicknesses in Cell-R, from 400 Å to 600 Å, are shown in FIGS. 22a and 22b, respectively. Devices with 300 Å, 400 Å 500 Å, and 600 Å-thick BCP exhibit forward-viewing EQEs peaking at (20.5±1.0)%, (21.6±1.0)%, and (24.3±1.0)%, and (23.1±1.0)%, respectively, at a current density of $J=1.4\times10^{-4}$ A/cm$^2$. The optimized G-G-G SOLED, with 500 Å-thick BCP in Cell-R, shows a peak forward-viewing PE=(19±1) lm/W at the current density of $J=1.7\times10^{-5}$ A/cm$^2$, which, rolls off to (12±1) lm/W at 1000 cd/m$^2$ corresponding to $J=1.2\times10^{-3}$ A/cm$^2$. The EQEs of the G-G-G SOLEDs are approximately the sum of the EQEs of the three individual OLEDs over a wide range of current densities, indicating that the losses at the transparent CGL are minimal.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

We claim:

1. An organic light emitting device comprising:
   a cathode;
   a blue-emitting sub-element comprising an emissive layer comprising a phosphorescent blue emissive material;
   a charge-generating layer;
   a green-emitting sub-element comprising an emissive layer comprising a phosphorescent green emissive material;
   a charge-generating layer;
   a red-emitting sub-element comprising an emissive layer comprising a phosphorescent red emissive material; and
   an anode;
   wherein each of the sub-elements has a charge balance factor of about 0.9 to 1,
   wherein the emissive layers of each sub-element are within about 20% of the distance to an antinode for that emitter,
   wherein each of the sub-elements is separated by a charge-generating layer, and
   wherein a combined emission of the emissive materials gives a white emission from the device.

2. The organic light emitting device of claim 1, wherein each of the sub-elements has a charge balance factor of about 0.95 to 1.

3. The organic light emitting device of claim 1, wherein each sub-element comprises a hole transporting layer, an electron transporting layer and the emissive layer, wherein the emissive layer is the hole transporting layer, the electron transporting layer or a separate layer.

4. The organic light emitting device of claim 1, wherein the device emits light having CIE coordinates of X=0.37±0.08, and Y=0.37±0.08.

5. The organic light emitting device of claim 1, wherein the device is capable of a maximum external quantum efficiency of at least about 30%.

6. The organic light emitting device of claim 1, wherein the charge-generating layers comprises an n-type layer adjacent to a p-type layer.

7. The organic light emitting device of claim 6, wherein the p-type layers comprise a material selected from $MoO_3$, $V_2O_5$, ITO, $TiO_2$, $WO_3$ and $SnO_2$.

8. The organic light emitting device of claim 7, wherein the p-type layers comprise $MoO_3$.

9. The organic light emitting device of claim 1, wherein at least two of the emissive layers are close enough to an antinode so as to provide at least 90% of its maximum emission.

10. The organic light emitting device of claim 9, wherein each of the emissive layers are close enough to an antinode so as to provide at least 90% of its maximum emission.

* * * * *